(12) United States Patent
Krestnikov et al.

(10) Patent No.: US 8,309,461 B2
(45) Date of Patent: Nov. 13, 2012

(54) DOUBLE-SIDED MONOLITHICALLY INTEGRATED OPTOELECTRONIC MODULE WITH TEMPERATURE COMPENSATION

(75) Inventors: Igor Krestnikov, Dortmund (DE); Juergen Kurb, Neuchatel (CH); Alexey Kovsh, Dortmund (DE); Alexey Zhukov, St. Petersburg (RU); Daniil Livshits, Dortmund (DE); Sergey Mikhrin, Dortmund (DE)

(73) Assignee: Innolume GmbH, Dortmund (DE)

( * ) Notice: Subject to any disclaimer, the term of this patent is extended or adjusted under 35 U.S.C. 154(b) by 349 days.

(21) Appl. No.: 12/508,810

(22) Filed: Jul. 24, 2009

(65) Prior Publication Data
US 2009/0286343 A1 Nov. 19, 2009

Related U.S. Application Data

(62) Division of application No. 11/380,067, filed on Apr. 25, 2006, now abandoned.

(51) Int. Cl.
*H01L 21/44* (2006.01)
(52) U.S. Cl. ............................. 438/667; 438/28; 438/34
(58) Field of Classification Search .................. 438/28, 438/34, 69, 666, 667; 257/E21.597, E21.598
See application file for complete search history.

(56) References Cited

U.S. PATENT DOCUMENTS

| | | |
|---|---|---|
| 4,807,022 A | 2/1989 | Kazior et al. |
| 5,003,359 A | 3/1991 | Abeles |
| 5,043,992 A | 8/1991 | Royer et al. |
| 5,170,235 A | 12/1992 | Tanino |
| 5,216,686 A | 6/1993 | Holm et al. |
| 5,397,933 A | 3/1995 | Yamada |
| 5,535,231 A | 7/1996 | Lee et al. |
| 5,761,230 A | 6/1998 | Oono et al. |
| 5,974,064 A | 10/1999 | Uchida |
| 6,226,114 B1 | 5/2001 | Ashkeboussi et al. |
| 6,455,398 B1 | 9/2002 | Fonstad, Jr. et al. |
| 6,888,178 B2 | 5/2005 | Fonstad, Jr. et al. |
| 6,912,333 B2 | 6/2005 | Mikawa et al. |
| 7,772,116 B2 * | 8/2010 | Akram et al. ................. 438/667 |
| 2003/0153116 A1* | 8/2003 | Carley et al. .................... 438/53 |
| 2004/0033008 A1 | 2/2004 | Mikawa et al. |

OTHER PUBLICATIONS

A. C. Grot et al., "Integration of LED's and GaAs Circuits by MBE Regrowth", IEEE Photonics Technology Letters, vol. 6, No. 7, Jul. 1994, pp. 819-821.

(Continued)

*Primary Examiner* — Thanhha Pham
(74) *Attorney, Agent, or Firm* — Brown & Michaels, PC

(57) ABSTRACT

An optoelectronic module includes a semiconductor structure with a substrate having a first side and a second side, a first layered structure deposited on the first side, and a second layered structure deposited on the second side. The optoelectronic module also includes driver circuitry fabricated of the first layered structure and a diode laser fabricated of the second layered structure. The driver circuitry produces a drive electrical signal supplied to the diode laser, and the diode laser produces an optical output in response to the drive electrical signal. In a preferred embodiment, the optoelectronic module also includes a temperature-sensitive element fabricated of the first or the second layered structure. The temperature-sensitive element produces a temperature dependent control signal related to the diode laser temperature.

45 Claims, 15 Drawing Sheets

OTHER PUBLICATIONS

T. Mikawa et al., "Implementation of Active Interposer for High-Speed and Low-Cost Chip Level Optical Interconnects", IEEE Journal of Selected Topics in Quantum Electronics, vol. 9, No. 2, Mar./Apr. 2003, pp. 452-549.

E. Atmaca et al., "Development of RM3 Technology to Integrate P-i-N Photodiodes on Si-CMOS for Optical Clock Distribution", The International Conference on Compound Semiconductor Manufacturing "Sharing Ideas Throughout the Industry", Paper 10B.2, 2004. (on-line digest is available on the web at http://www.gaasmantech.org/Digests/2004/).

A. Kash et al. "Chip-To-Chip Optical Interconnects", OFC/NFOEC Technical Conference 2006 (Mar. 5-10, 2006, Anaheim, California, USA) Paper OFA3.

* cited by examiner (a) PRIOR ART (b)

DOUBLE-SIDED MONOLITHICALLY INTEGRATED OPTOELECTRONIC MODULE WITH TEMPERATURE COMPENSATION

REFERENCE TO RELATED APPLICATIONS

This is a divisional patent application of copending application Ser. No. 11/380,067, filed Apr. 25, 2006, entitled "DOUBLE-SIDED MONOLITHICALLY INTEGRATED OPTOELECTRONIC MODULE WITH TEMPERATURE COMPENSATION. The aforementioned application is hereby incorporated herein by reference.

BACKGROUND OF THE INVENTION

1. Field of the Invention

This invention relates to methods and devices for stabilizing a diode laser optical output with respect to temperature variations. This invention further relates to methods and devices for monolithic integration of a diode laser with a driver circuitry.

2. Description of Related Art

A semiconductor diode laser emits an optical output power in response to an electrical input signal. The input signal, e.g. an injection current, is applied to the laser contacts being provided by an external control circuitry, also known as laser driver circuitry. It is well recognized that co-location of electronic circuits and light-emitting devices, e.g. a driver circuitry and a diode laser, is frequently the most cost-effective solution due to the higher level of integration. However, it is difficult to integrate monolithically the diode laser and the driver circuitry. For example, an integration of III-V optoelectronic components with CMOS-based (or similar) silicon electronics is a complicated problem because of the difference in lattice parameters and thermal expansion coefficients. Integration of III-V optoelectronic components with III-V electronic components seems to be more realistic owing to similarity in materials used. Moreover, III-V Field Effect Transistors (FETs), in particular GaAs MEtal-Semiconductor FETs (MESFETs), GaAs High-Electron Mobility Transistors (HEMTs) and Pseudomorphic HEMTs (PHEMTs), and InP HEMTs and PHEMTs, are among the most efficient high-speed microelectronic devices currently available. In this context the use of III-V electronics can be advantageous because high-speed modulation of a diode laser would require corresponding high-speed operation of a driver circuitry.

However, FETs usually need to be formed on a semi-insulating substrate, while the semiconductor laser usually needs a conductive III-V substrate or buffer. Therefore, formation of FET-based driver circuitry on top of the diode laser layers is impossible because FETs operating at high-frequencies are short-circuited by parallel conductivity of these conductive layers. The driver circuitry and the diode laser, however, can be located beside each other. To do so, the conductive layers of the diode laser structure should be locally etched out and the layers of the driver circuitry should be located at the recess. Alternatively, the layers of driver circuitry should be locally etched out and the layers of the laser structure should be located at the recess. The most challenging part of this approach is filling the recess. One technique proposed was Epitaxy-on-Electronics (EoE), in which the desired layered structure is grown directly in the recesses. One example of implementation of this method is presented in A. C. Grot, et al., "Integration of LED's and GaAs circuits by MBE regrowth", IEEE Photonics Technology Letters, Vol. 6, No. 7, July 1994, pp. 819-821. Another technique, Aligned Pillar Bonding (APB), involves growing the desired heterostructures in an inverse sequence on a separate wafer, etching it into a pattern of pillars, mirroring the pattern of recesses, and then aligning and bonding the two wafers together. EoE and APB techniques are discussed in U.S. Pat. No. 6,888,178 and in E. Atmaca, et al., "Development of RM3 technology to integrate P-i-N photodiodes on Si-CMOS for optical clock distribution", The International Conference on Compound Semiconductor Manufacturing Technology "Sharing Ideas Throughout the Industry". Both of these techniques are often difficult to realize taking into account a large depth of diode laser structures, especially vertical cavity surface emitting lasers.

Thus, methods for the monolithic integration of the FET-based high-speed driver circuitry and the diode laser are not well developed in the prior art.

It is strongly desired, in particular for optical communication systems, to have a stable optical output signal from a diode laser regardless of the temperature variation. It would be very advantageous to achieve temperature insensitivity of the internal laser parameters such as the threshold current and the slope efficiency. However, in spite of certain progress in this direction, the temperature sensitivity of the laser parameters in the current state of the art is typically unsatisfactory. Also, it is quite difficult to achieve a stabilization of the laser temperature during a long period of laser operation. This is due to two factors. First, the ambient temperature may change rapidly and unpredictably in a wide range. Second, the temperature of the active region of the laser affects the laser parameters. This temperature can be at least twenty degrees different than the temperature of the heat-sink. Therefore, a diode laser needs temperature compensation in order to produce stable optical output. To this end, driver circuitry should vary an input signal which is supplied to the diode laser. If the input signal represents a combination of the bias signal and the modulation signal, both components should be varied independently.

One solution known in the art is optical feedback. A photodetector actually senses the intensity of the laser radiation emitted from the back facet of the laser, which is in known proportion with the laser output power emitted from the front facet. The output of the photodetector is used to increase the drive current to compensate for diminished output with rising temperature. However, use of backface monitoring does not completely solve the problem of laser output changes as a function of temperature. In particular, this technique is incapable of adjusting the optical modulation amplitude. Another known solution for temperature compensation of the laser output is an adjustment of the drive signal in response to the temperature variation. In particular, U.S. Pat. No. 5,043,992 discloses a laser driver which includes a reference circuit mounted in thermal contact with the laser. The reference circuit produces a current component that is proportional to the absolute temperature. This provides for the required increase in the modulation current to compensate for temperature variations in the laser output. The driver circuitry and the laser may be constructed on the same integrated circuit.

Thus, there is a need for a diode laser with temperature compensation monolithically integrated with high-speed driver circuitry.

SUMMARY OF THE INVENTION

The present invention provides a method for fabricating an optoelectronic module including a diode laser monolithically integrated to driver circuitry. The present invention also includes a compact laser device suitable for high-speed modulation with temperature-stabilized optical output.

The present invention includes a double-sided monolithically integrated optoelectronic module. The module includes a semiconductor structure. The semiconductor structure includes a substrate having a first side and a second side, a first layered structure deposited on the first side of the substrate, and a second layered structure deposited on the second side of the substrate. The optoelectronic module includes driver circuitry fabricated from the first layered structure and a diode laser or an array of diode lasers fabricated from the second layered structure. The driver circuitry is electrically connected to the diode laser, preferably by means of via-hole conductive paths made through the substrate. The driver circuitry produces a drive electrical signal supplied to the diode laser, and the diode laser produces an optical output in response to the drive electrical signal.

In a preferred embodiment the optoelectronic module also includes a temperature-sensitive element fabricated from the first or the second layered structure. The temperature-sensitive element produces a temperature dependent control signal related to the diode laser temperature. The temperature dependent control signal is dependent on the temperature of the diode laser. In one embodiment, the dependence is nearly linear. The drive electrical signal is varied in response to the temperature dependent signal such that the optical output is nearly temperature independent in a certain interval of ambient temperatures. Thus, in a preferred embodiment, the optoelectronic module is a double-sided monolithically integrated optoelectronic module with temperature compensation.

The substrate is preferably a semi-insulating semiconductor substrate. In this embodiment, the driver circuitry may be based on III-V field-effect transistors. In this embodiment, the second layered structure preferably includes a significantly thick conductive buffer.

The diode laser is preferably a vertical cavity surface emitting laser. The optoelectronic module is preferably used in an optical fiber communication system, an optical interchip connection system, or the like.

The drive electrical signal may be a superposition of a DC bias current and a modulation current. The driver circuitry, in response to the temperature dependent control signal, changes the magnitude of the bias signal and the amplitude of the modulation signal such that the average output power and the optical modulation amplitude of the diode laser remain stable in a certain temperature interval.

The optoelectronic module of the present invention preferably uses a double-sided epi-ready substrate. The optoelectronic module is preferably fabricated by epitaxially depositing the first layered structure and a protective film on the first side of the substrate, depositing the second layered structure and subsequently removing the protective film. Preferably the conditions of the deposition of the first layered structure and the protective film are selected such that the second side of the substrate remains stable and is therefore suitable for subsequent deposition of semiconductor thin films. The protective film is selected such that it is capable of protecting the first layered structure against degradation, such as decomposition, erosion and other destructive processes which can be caused by high-temperature treatment during subsequent epitaxial growth on the second side of the substrate.

The FET-based driver circuitry and the diode laser are preferably designed for high-speed operation. Close proximity between the device's parts (i.e. the diode laser, the temperature-sensitive element, and the drive circuitry as a whole) enables high-density packaging, ensures precise temperature monitoring, and may improve high-speed characteristics due to low series resistance, low cross-talks, and high-speed electronic components. An advantage is that the approach may be fully compatible with mass-production technology. The process may readily be scaled up or down as the wafer size increases or decreases with minor modification. An additional advantage of the method of the present invention is a reduction of chip area compared to a method of location of the diode laser and the driver circuitry at the same side of the substrate.

DETAILED DESCRIPTION OF THE INVENTION

Figure 1:
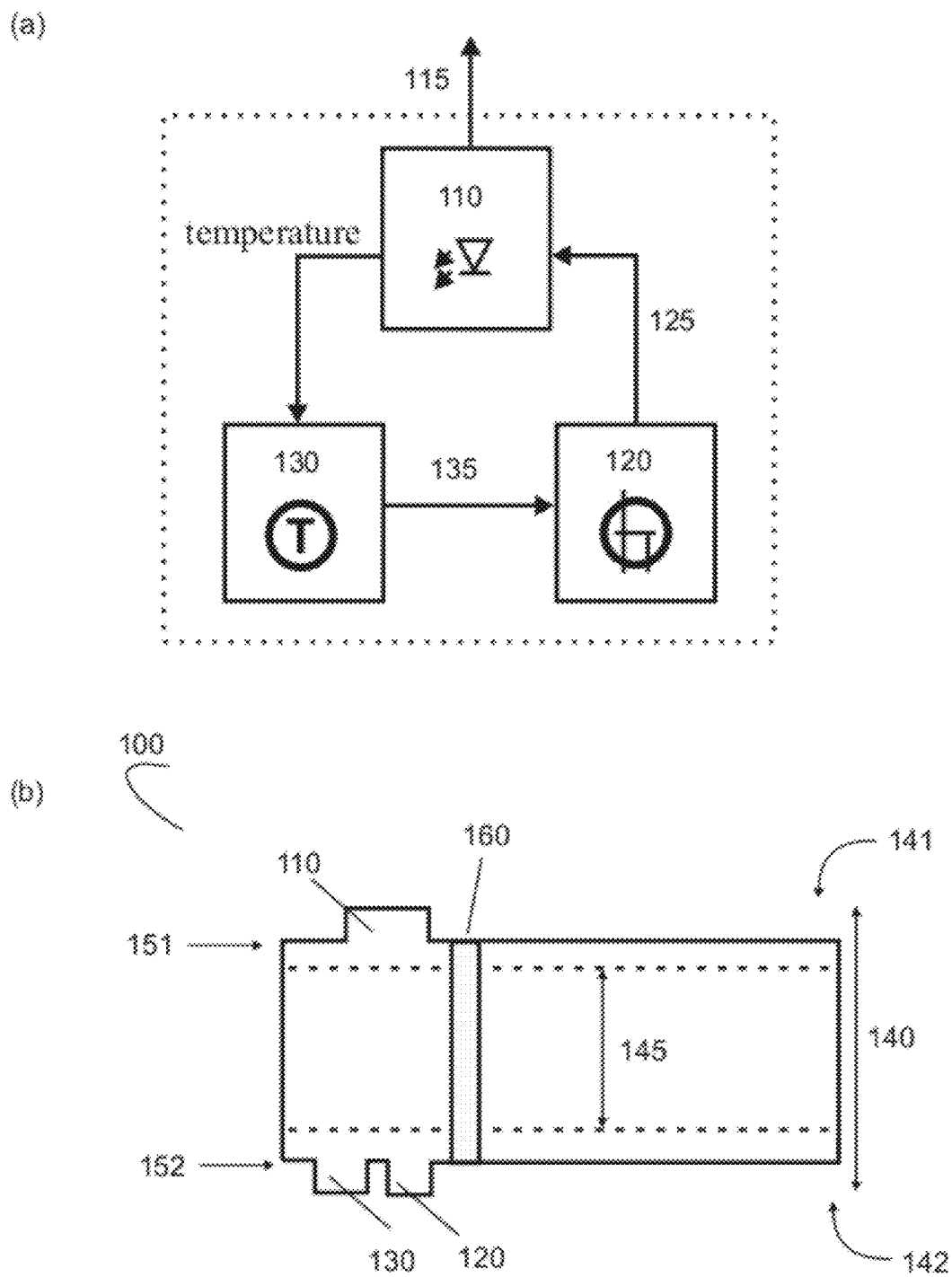
FIG. 1(a) illustrates an operation and temperature compensation method of the monolithically integrated optoelectronic module according to a preferred embodiment of the present invention.
FIG. 1(b) illustrates a monolithically integrated structure of the monolithically integrated optoelectronic module according to an embodiment of the present invention.

A double-sided monolithically integrated optoelectronic module (100) according to a preferred embodiment of the present invention is illustrated in FIG. 1. FIG. 1(a) illustrates the operation and a temperature compensation method of the module and FIG. 1(b) illustrates a monolithically integrated structure of the module according to one embodiment of the present invention.

The optoelectronic module (100) includes at least two parts: a driver circuitry (120) and a diode laser (110). The driver circuitry (120) produces a drive electrical signal (125) supplied to the diode laser (110), and the diode laser (110) produces an optical output (115) in response to the drive electrical signal (125).

In a preferred embodiment, the module also further includes a temperature-sensitive element (130). The temperature-sensitive element (130) is preferably fabricated in thermal contact with the diode laser (110). This means that the temperature-sensitive element is capable of producing a temperature-dependent control signal (135) (for example, voltage or current) related to the temperature of the diode laser (110). For temperature-stabilized operation, the temperature-sensitive element (130) provides a temperature dependent control signal (135) to the driver circuitry (120), and the driver circuitry (120) varies the drive electrical signal (125) in response to the temperature dependent control signal (135) in a predetermined manner such that the optical output (115) of the diode laser (110) remains nearly independent of temperature in a certain interval of ambient temperatures.

Figure 10:
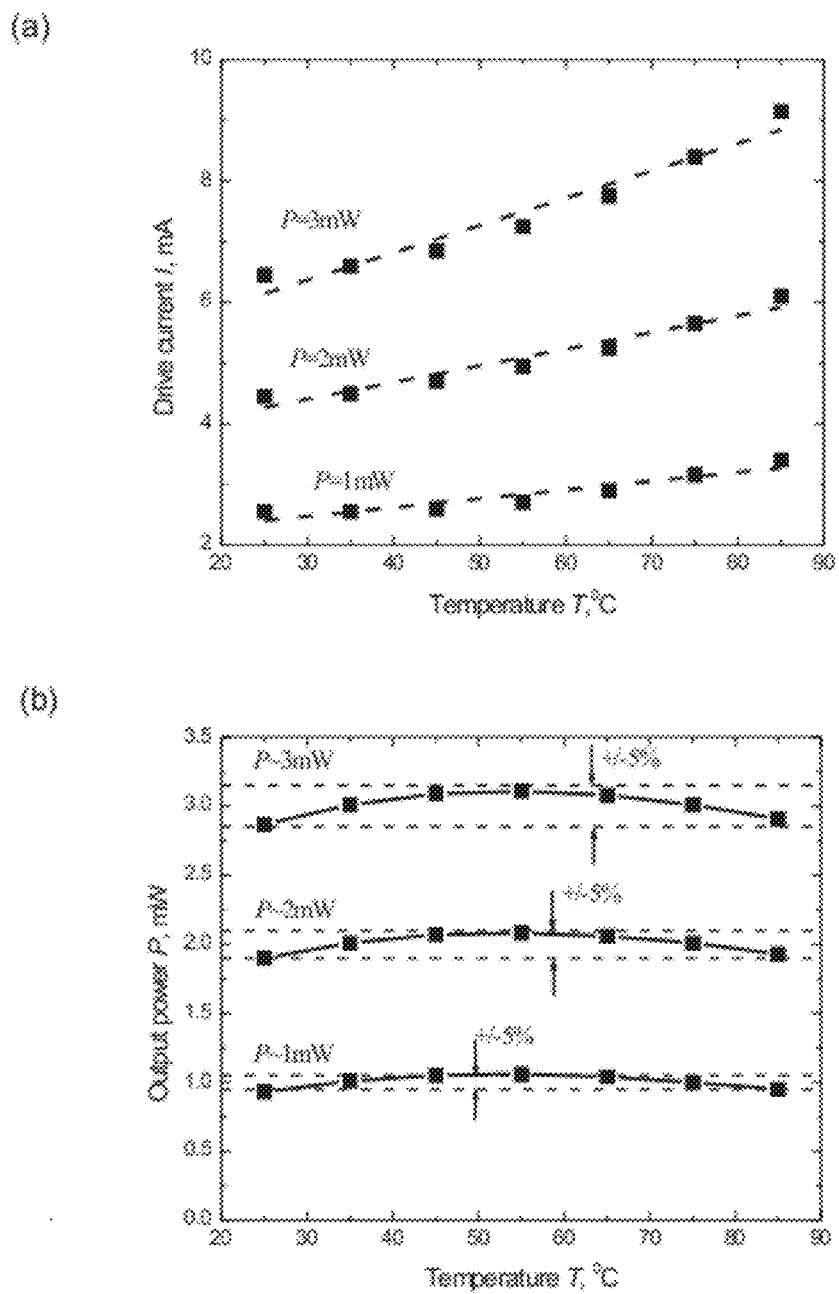
FIG. 10(a) shows temperature variation of the drive current required for the VCSEL module, fabricated in accordance with an embodiment of the present invention, to reach the output power of 1, 2, or 3 mW (solid symbols) output power and its fit by linear function (dashed lines) to use in temperature-compensated operation.
FIG. 10(b) shows temperature variation of the output power of the VCSEL module, fabricated in accordance with an embodiment of the present invention, operating with temperature compensation.
Figure 13:
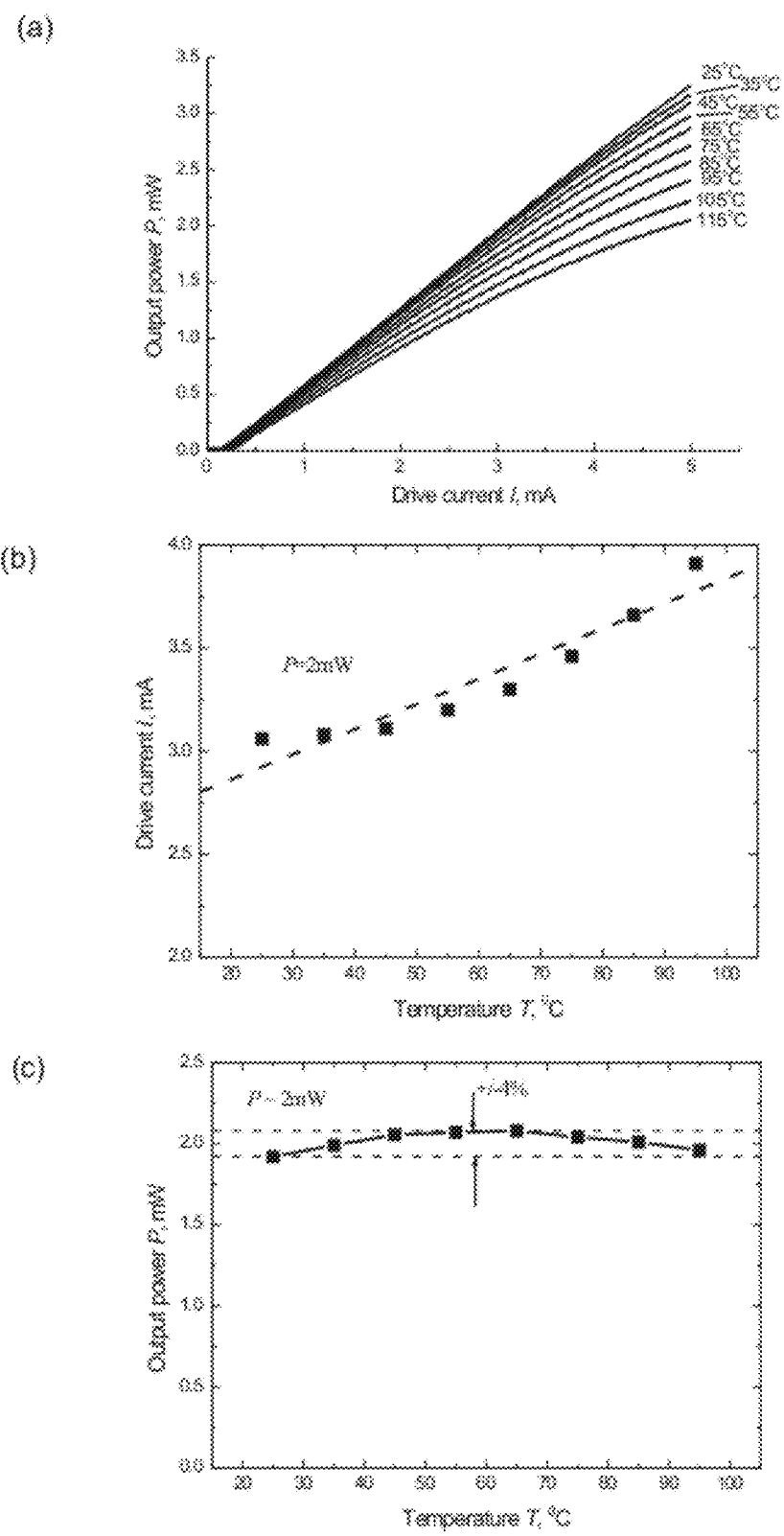
FIG. 13(a) shows light-current characteristics of another VCSEL module, fabricated in accordance with an embodiment of the present invention, operating at different temperatures without temperature compensation.
FIG. 13(b) shows temperature variation of the drive current required for the VCSEL module, fabricated in accordance with an embodiment of the present invention, to reach the output power of 2 mW (solid symbols) output power and its fit by linear function (dashed line) to use in temperature-compensated operation.
FIG. 13(c) shows temperature variation of the output power of the VCSEL module, fabricated in accordance with an embodiment of the present invention, operating with temperature compensation.

As one can see from FIG. 10(a) and FIG. 13(b), the current is not an exact linear function of the temperature. This dependence is nearly exponential. If one varies the operation current by electronic means exactly as this function, the output power of the laser remains constant at any temperature.

However, it is difficult to vary the operation current with temperature exactly as it is required for absolutely temperature-stable behavior. Approximately linear variation is the simplest method for electronic control system. Because one uses a linear function whereas the exact dependence is not linear, the operation current and the required current diverge.

As a result, the output power remains nearly constant (for example better than +/−1%) within a very narrow temperature interval (for example only 10° C.). However, if the stabilization requirement is not so strict, the temperature interval, where the output power is nearly stable, is broader. Also, if the diode laser characteristics are less temperature-sensitive, the interval of temperatures is broader.

The width of the temperature stabilization interval depends on temperature sensitivity of laser characteristics, such as a threshold current and a slope efficiency. The width of the temperature stabilization interval also depends on required accuracy of the output power stabilization. For most diode laser applications, a temperature stabilization with +/−5% accuracy seems to be sufficient. For typical temperature sensitivity of the diode laser characteristics the method of the present invention can provide a +/−5% stabilization within approximately a 50° C.-60° C. temperature interval, for example from 25 to 85° C.

All elements of the module (100) are monolithically integrated on a single substrate, as illustrated in FIG. 1(b). The module is made of a semiconductor structure (140) including a substrate (145) having a first side (142) and a second side (141), a first layered structure (152) deposited on the first side (142) of the substrate (145), and a second layered structure (151) deposited on the second side (141) of the substrate (145). The first layered structure (152) and the second layered structure (151) each include at least one layer, but may be any number of layers, depending on the device being fabricated. The microelectronic components of the driver circuitry (120) are fabricated from the first layered structure (152). The diode laser (110) is fabricated from the second layered structure (151).

In one embodiment, shown in FIG. 1(b), the temperature-sensitive element (130) is fabricated from the first layered structure (152). In another embodiment, the temperature-sensitive element is fabricated from the second layered structure. In still another embodiment, the optoelectronic module (100) does not include a temperature-sensitive element.

In the embodiment shown in FIG. 1(b), the components fabricated on the first side (142) of the substrate are electrically connected to the components fabricated on the second side (141) of the substrate by means of via-hole conductive paths (160) made through the substrate (145). Alternatively, the components fabricated on the first side (142) of the substrate can be electrically connected to the components fabricated on the second side (141) of the substrate by means of external wires.

Use of via-holes (also often called "through-holes") can significantly simplify integration of several micro- and optoelectronic components. U.S. Pat. No. 6,912,333 describes an optical element module formed with an epitaxial lift-off process and an optical-element driving module for driving the optical element module, where both the optical element module and the optical-element driving module have a through hole that passes through from one surface to the other surface, and are connected electrically via a conductor in the through hole. All parts are connected electrically mutually via conductors in the through hole. A similar approach is also discussed in IEEE Journal of Selected Topics in Quantum Electronics, Vol. 9, No. 2, March/April 2003, pp. 452-459.

Figure 2:
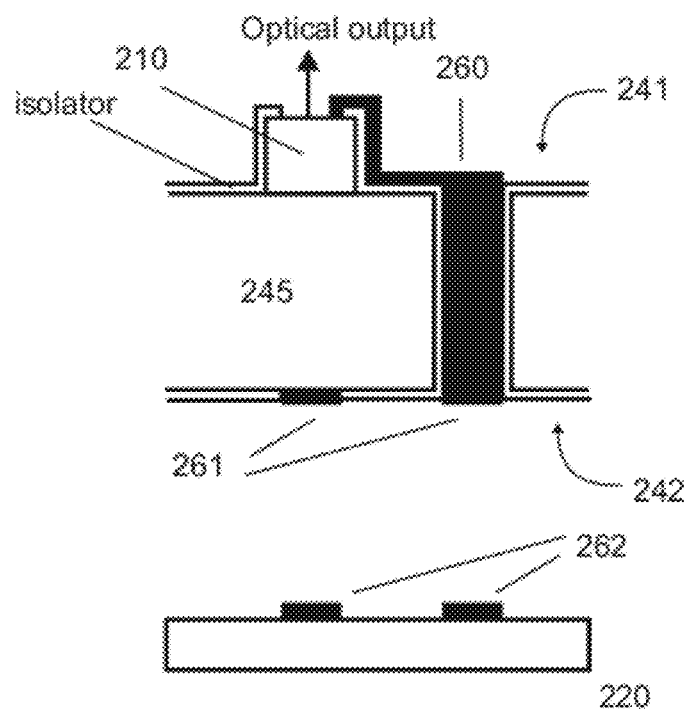
FIG. 2(a) illustrates a hybrid integration of a diode laser and a driver IC by a prior art method.
FIG. 2(b) illustrates a structure of a monolithically integrated optoelectronic module according to an embodiment of the present invention.
Figure 2:
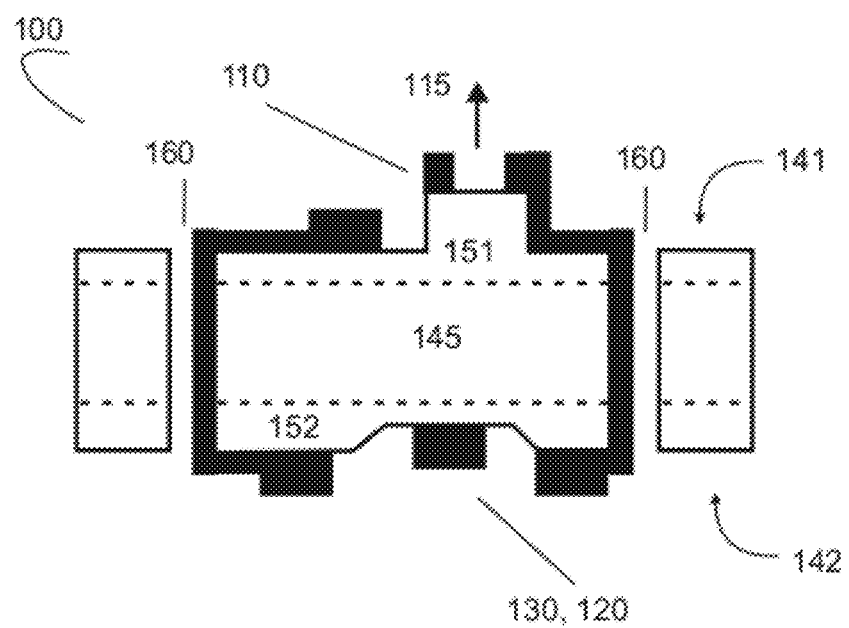

FIG. 2(a) shows schematically a hybrid integration of a diode laser (210) and a driver circuitry (220) by a prior art method. One side (241) of the substrate (245) is primarily used to allocate the diode laser (210) while another side (242) of the substrate (245) is primarily used to allocate conductive pads (261) and to attach the driver circuitry (220) by means of conductive bumps (262). Via-hole connections (260) are used to connect one electrode of the diode laser (210) with one of the conductive pads (261). A conductive substrate (245) is typically used. In one example, the substrate (245) is an n-type doped substrate. The driver IC (220) is preferably placed on a submounting substrate. The diode laser (210) and the driver circuitry (220) are therefore hybridly integrated. Formation of the optoelectronic module including a diode laser and a driver IC is therefore complicated in the prior art.

FIG. 2(b) shows in more detail a structure of the double-sided monolithically integrated optoelectronic module (100) according to an embodiment of the present invention. The diode laser (110) is shown as a vertical cavity surface emitting laser (VCSEL) in the figure. However, other types of diode lasers, for example edge-emitting diode lasers or mode-locked edge-emitting diode lasers, may be alternatively integrated by the method of the present invention. As opposed to the prior art method of FIG. 2(a), in the method of the present invention, the first side (142) of the substrate (145) is used to allocate active electronic elements such as the temperature-sensitive element (130) and the driver circuitry (120). Because the diode laser is typically fabricated of III-V materials, the same materials are preferably used to fabricate high-speed electronic components, e.g. MESFETs, PHEMTs or the like. As a result, high-speed modulation of the diode laser is significantly simplified. Also, because the components are compactly located by being electrically connected through the via-holes (160), conductive path lengths may be shortened.

FIGS. 3(a) to 3(i) schematically show the steps in fabricating an optoelectronic module according to an embodiment of the present invention.

FIG. 3(a) shows an initial substrate (145). The substrate is preferably a semi-insulating substrate made of III-V materials. In one example, the substrate (145) is a GaAs semi-insulating substrate. In another example, the substrate (145) is an InP:Fe semi-insulating substrate. Typical substrate thickness is preferably 350-600 micrometers, and substrate diameter is preferably 2, 3, or 4 inches. The substrate is preferably an epi-ready substrate such that at least one side of the substrate (the first side (142) in the figures) is suitable for epitaxial deposition of semiconductor thin films. The substrate is preferably a double-sided epi-ready substrate.

As illustrated in FIG. 3(b), a first layered structure (152), suitable for subsequent formation of microelectronic components of the driver circuitry (120) and the temperature-sensitive element (130), is formed on the first side (142) of the substrate (145). If the substrate (145) is a semi-insulating semiconductor substrate, then the first layered structure (152) may by chosen such that it is suitable for fabrication of MESFETs, HEMTs, PHEMTs, or other unipolar devices in subsequent steps. Although an ion implantation method may be used to form the first layered structure, the first layered structure is preferably formed by epitaxial deposition of semiconductor thin films.

The method of deposition can be any known epitaxial method suitable for the materials used. For example, it may be molecular beam epitaxy (MBE) or metal organic chemical vapor deposition (MOCVD). Preferably the conditions of the deposition of the first layered structure (152) are selected such that the second side (141) of the substrate (145) remains stable and is therefore suitable for subsequent deposition of semiconductor thin films. For example, if the MBE method is used and the substrate is a GaAs substrate, the deposition temperature preferably does not exceed 600-610° C. and more preferably remains below 500-520° C. for most of the deposition time for the first layered structure (152).

The first layered structure (152) deposited on the first side (142) of the substrate (145) is preferably protected by a protective film (302), as shown in FIG. 3(c). The protective film (302) is selected such that it is capable of protecting the first layered structure (152) against decomposition, erosion and other destructive processes which can be caused by high-temperature treatment during subsequent epitaxial growth on the second side (141) of the substrate (145).

A second layered structure (151) is deposited on the second side (141) of the substrate (145), as shown in FIG. 3(d). The second layered structure (151) is designed such that it is suitable for subsequent fabrication of the diode laser (110), for example for fabrication of a vertical cavity surface emitting laser. If the substrate (145) is a semi-insulating semiconductor substrate, then a sufficiently thick conductive buffer layer may be deposited as a part of the second layered structure.

In the next step, as shown schematically in FIG. 3(e), the diode laser (110) is formed from the second layered structure (151) using conventional methods of optoelectronic device fabrication. These methods may include photolithography, dry etching, wet etching, lift-off processes, and other technological steps known to those skilled in the art. The choice of the steps needed to form the diode laser depends on the type of diode laser, its specific geometry and total thickness. Then, conductive paths are fabricated on the second side (141) of the substrate (145).

Then, the protective film (302) is removed, for example using selective etching and the necessary microelectronic components of the driver circuitry (120) are formed from the first layered structure (152) by conventional methods of microelectronic device fabrication, as illustrated in FIG. 3(f). In one embodiment, the protective film (302) is completely removed by two rounds of selective etching. In a preferred embodiment, microelectronic components of the temperature-sensitive element (130) are also formed during this step. The methods used may include photolithography, e-beam lithography, dry etching, wet etching, metal deposition, lift-off processes, and other technological steps known to those skilled in the art. The choice of steps needed to form the driver circuitry and/or the temperature-sensitive element depends on the kind of driver circuitry (120) and the temperature-sensitive element (130), their specific layout and constituent devices.

Figure 3:
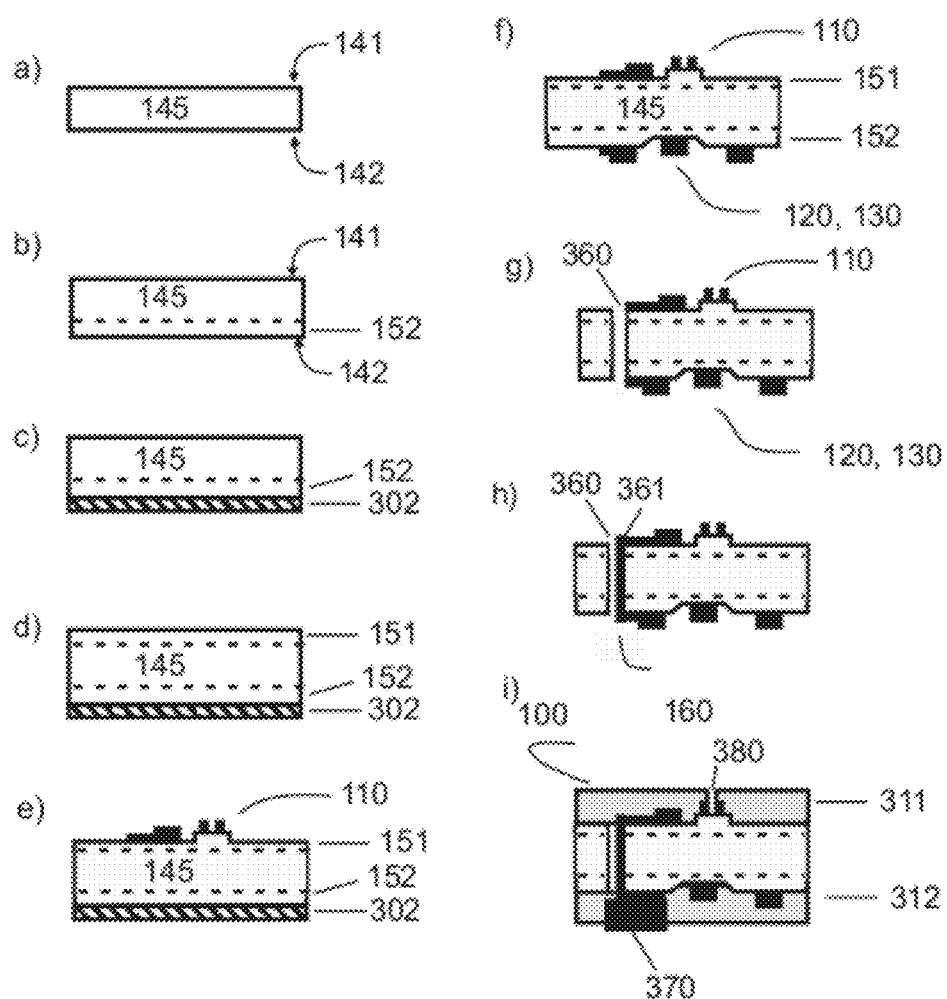
FIG. 3(a) shows an initial substrate in a method of fabricating an optoelectronic module according to the present invention.
FIG. 3(b) shows a first layered structure formed on a first side of the substrate in a method of the present invention.
FIG. 3(c) shows a protective film covering the first layered structure deposited on the first side of the substrate in a method of the present invention.
FIG. 3(d) shows a second layered structure deposited on a second side of the substrate in a method of the present invention.
FIG. 3(e) shows a diode laser formed from the second layered structure in a method of the present invention.
FIG. 3(f) shows driver circuitry formed from the first layered structure in a method of the present invention.
FIG. 3(g) shows the formation of via-holes in a method of the present invention.
FIG. 3(h) shows the first side and the second side of the substrate locally connected by the via-hole conductive paths in a method of the present invention.
FIG. 3(i) shows the microelectronic components and the conductive paths being optionally planarized and protected by a dielectric coating in a method of the present invention.

In the embodiment illustrated in FIG. 3, the components fabricated on the first side (142) and the components fabricated on the second side (141) of the substrate (145) are electrically connected by means of via-hole conductive paths (160). As illustrated in FIG. 3(g), via-holes (360) intended for formation of conductive paths (160) through the substrate are formed in the next step.

The side walls of the via-holes (360) are preferably covered with a metal layer (361) such that the first side (142) and the second side (141) of the substrate (145) are locally connected by the via-hole conductive paths (160), as shown in FIG. 3(h).

FIG. 3(i) shows the microelectronic components and the conductive paths fabricated on the first side (142) of the substrate being optionally planarized and protected by a dielectric coating (312) such that the first side is completely coated except in several predetermined places where conductive pads (370) are formed. In addition, the diode laser (110) fabricated on the second side (141) of the substrate (145) is preferably planarized and protected by a dielectric coating (311) such that the second side is completely coated except for an output aperture (380) suitable for outputting the optical output (115). The dielectric coating (311) and (312) is preferably SiO$_2$ or Si$_3$N$_4$ or other suitable materials.

Finally, the optoelectronic module (100) may be bonded on a bearing submount and sealed in a suitable package which enables inputting the electric power from an external electric power supply, and outputting the optical output.

Although a particular sequence of steps has been described here, if the laser structure being fabricated does not require high temperatures for deposition, the diode laser side of the structure may alternatively be deposited before the driver circuitry is deposited.

The method of fabricating an optoelectronic module may also include other steps not shown in FIG. 3. Each step of optoelectronic module fabrication may require numerous technological operations which are not shown in the details in FIG. 3. The specific number and sequence of additional steps depend on the particular design of the laser and microelectronic components being fabricated. The design of the optoelectronic module is determined by the particular application in which the module is to be used. Some of the additional steps involved may include, but are not limited to, photolithography, metal deposition, etching, cleaning, and other operation known to those skilled in the art.

For example, it is sometimes suitable to have a laser beam emitted in a direction perpendicular to the substrate. For this purpose a VCSEL may be used as a diode laser. If the diode laser is a VCSEL, its fabrication requires several etching procedures, several metal depositions, contact annealing, aperture oxidation, etc. For some of these operations, certain parts of the structure or its other side must be covered with resist, wax, or another protective substance. Then the structure must be cleaned in organic solvents.

Figure 4:
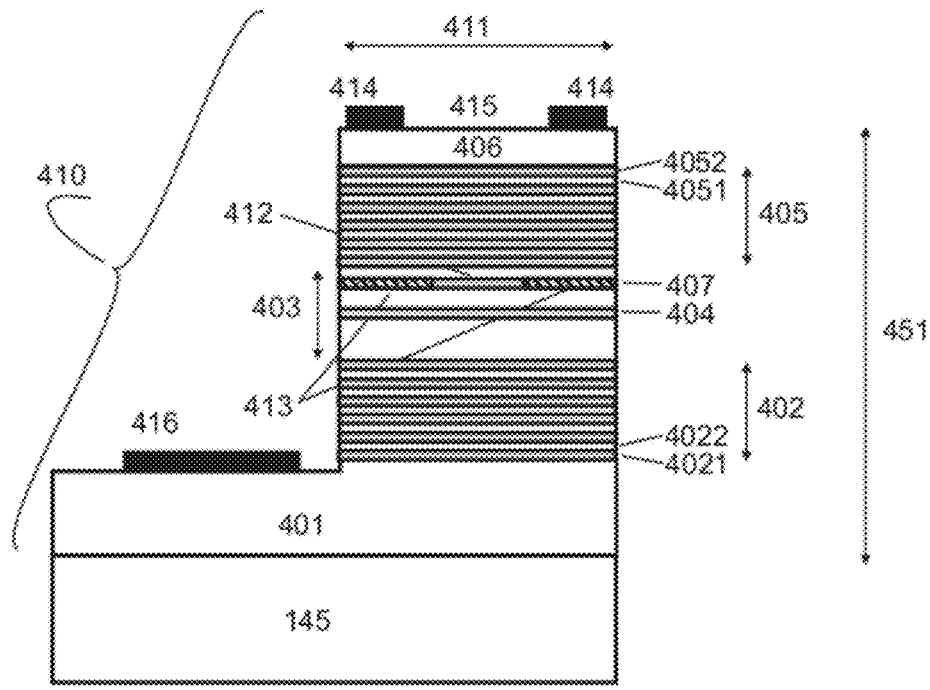
FIG. 4 shows a first layered structure and a diode laser of the optoelectronic module according to a preferred embodiment.

FIG. 4 illustrates a second layered structure (451) deposited on the second side (141) of the substrate (145) and a diode laser (410) of the optoelectronic module (100) fabricated from the second layered structure (451) according to a preferred embodiment (shown not to scale). In this embodiment, the substrate (145) is preferably a semi-insulating GaAs substrate and the diode laser (410) is a vertical cavity surface emitting laser (VCSEL).

The second layered (451) structure includes, in order, a heavily n-type doped buffer layer (401), a first distributed Bragg reflector (DBR) (402), a microcavity (403) in which an active region (404) is located, a second DBR (405), and a heavily p-type doped cap layer (406). In a preferred embodiment, the layers in the second layered structure (451) are preferably a heavily n-type doped GaAs buffer layer (401), a first distributed Bragg reflector (DBR) (402) with a quarter-wavelength stack of n-type doped AlGaAs layers (4021) and GaAs layers (4022), an (Al)GaAs microcavity (403) in which the active region (404) is located, a second DBR (405) with a quarter-wavelength stack of p-type doped AlGaAs layers (4051) and GaAs layers (4052), and a heavily p-type doped GaAs cap layer (406).

The conductive buffer layer (401) is preferably thicker than 1 micrometer and more preferably thicker than 2 micrometers. The concentration of free electrons is preferably higher than $10^{18}$ cm$^{-3}$. It is preferred that the microcavity (403) further includes an aperture layer (407). The aperture layer (407) is preferably an AlGaAs aperture layer (407) with an Al mole fraction sufficiently high and suitable for selective oxidation process, e.g. 98%. Optical reflectivity of the second DBR (405) is preferably smaller than optical reflectivity of the first DBR (402) such that the optical power is mostly output through the second DBR (402).

The active region (404) may include, but is not limited to, an InGaAs multiple quantum well (MQW) structure or a self-organized In(Ga)As quantum dot (QD) structure. The active region (404) is preferably designed to emit around 0.9-1.2 μm using an MQW structure or around 1.2-1.3 μm using a QD structure.

The VCSEL (410) is defined by etching of a mesa (411) preferably having a typical diameter of about 100 micrometers. Etching is preferably carried out through the cap layer (406), the second DBR (405), the microcavity (403), the first DBR (402) and preferably terminated in the upper part of the n-type buffer layer (401) such that part of the n-type doped buffer layer becomes exposed. Typical etching depth is about 5 micrometers.

The aperture (412), which preferably has a diameter around 10 micrometers, is defined by a selectively oxidized periphery (413) of the aperture layer (407). A p-type ohmic metal contact (414) is formed on the heavily p-type doped GaAs cap layer (406). In a plan view, the p-type metal contact (414) is preferably ring-shaped such that the central part (415) of the etched mesa (411) is not covered by metal and therefore suitable for light output. An n-type ohmic metal contact (416) is formed on the exposed part of the heavily n-type doped buffer layer (401) such that the etched mesa (411) is optionally surrounded by the n-type metal contact (416). In operation, an input electrical signal, which can be a superposition of a DC bias signal and modulation signal, is supplied to the n-type and p-type contacts (416) and (414), respectively.

Figure 5:
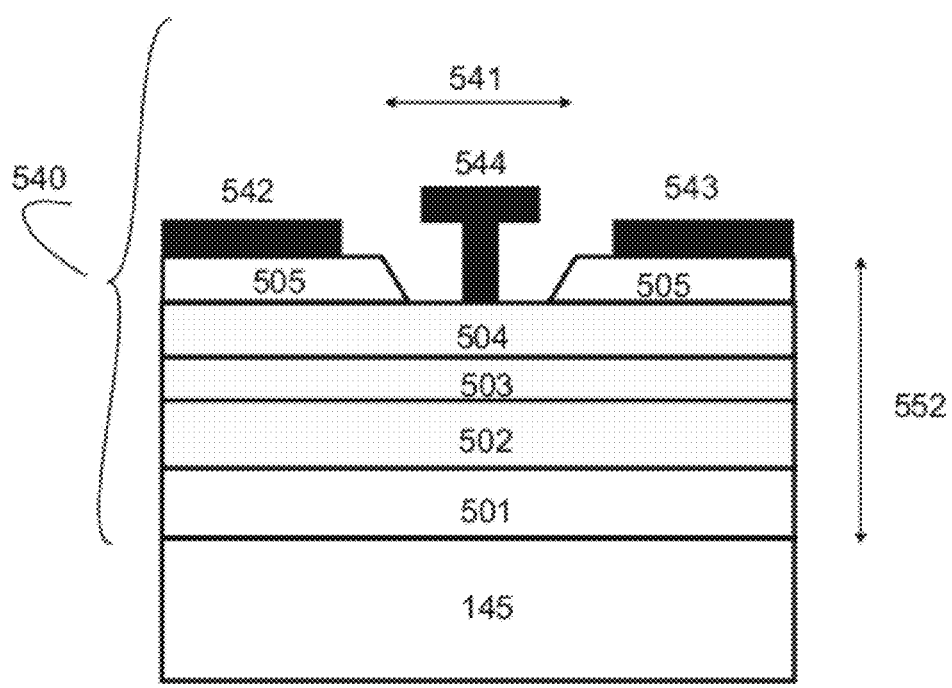
FIG. 5 illustrates a second layered structure and a microelectronic element of a driver circuitry.

FIG. 5 illustrates a first layered structure (552) deposited on the first side (142) of the substrate (145) according to a preferred embodiment. The first layered structure (552) includes, in order, a buffer layer (501), an n-type modulation doped first barrier layer (502), a thin channel layer (503), an n-type modulation doped second barrier layer (504), and a heavily n-type doped cap layer (505). In this embodiment, the substrate (145) is preferably a semi-insulating GaAs substrate. The first layered structure (552) is preferably made of a GaAs buffer layer (501), an n-type modulation doped first AlGaAs barrier layer (502), a thin InGaAs channel layer (503), an n-type modulation doped second AlGaAs barrier layer (504), and a heavily n-type doped GaAs cap layer (505). Modulation doping means that the concentration of the dopants along the layer depth is not uniform such that certain parts of the layer (502) or (504) are heavily doped with n-type dopants while other parts are weakly doped or undoped.

The first layered structure (552) is preferably deposited by using an MBE method at temperatures below 500-520° C. for most of the deposition of the first layered structure. The second side (141) of the substrate (145) remains of epi-ready quality and suitable for subsequent deposition of semiconductor thin films.

FIG. 5 also schematically illustrates a basic element of the driver circuitry which represents a PHEMT (540). The PHEMT (540) is preferably an AlGaAs/InGaAs/GaAs PHEMT. A gate area is defined by an etched recess (541). Depth of the recess (541) is preferably less than the depth of the heavily doped n-type GaAs cap layer (505). In one embodiment, the depth of the recess (541) is a few nanometers less than the depth of the cap layer (505) because the gate metal is easier to put on GaAs than on AlGaAs. To keep a narrow residual GaAs, an additional stop-layer (for example GaAsP) for selective etching may be optionally used.

The source ohmic contact (542) and the drain ohmic contact (543) are formed to the heavily doped n-type GaAs cap layer (505) on sides of the recess (541). A gate electrode (544) is formed within the recess (541). The gate electrode (544) is formed by deposition of metal forming a Schottky barrier to the underlying semiconductor material. In cross-sectional view, the gate electrode (544) is preferably T-shaped or mushroom-shaped. In plan view, the gate length is typically about 0.1-0.5 micrometers and the gate width is typically about 50 micrometers.

Other (passive) elements such as microelectronic resistors, capacitors and the like may be optionally formed from the first layered structure (552). The PHEMTs and the other elements are electrically connected by the conductive paths formed on the second side of the substrate (145) thereby forming a driver circuitry (120) of the optoelectronic module (100).

Figure 12:
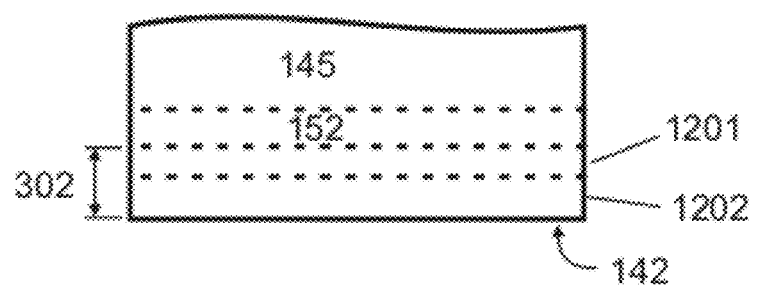
FIG. 12 illustrates a structure of a protective film according to an embodiment of the present invention.

FIG. 12 illustrates schematically the protective film (302) according to one embodiment of the present invention. The protective film (302) includes an etch-stop layer (1201) followed by a temperature stable layer (1202). The protective film (302) is preferably deposited immediately upon the completion of deposition of the first layered structure (152), by the same epitaxial method, and in the same epitaxial machine. For example, the protective film (302) is preferably deposited using an MBE method.

The etch-stop layer (1201) is selected such that a significant difference (for example, more than 100) in etching rates may be achieved in subsequent technological steps between the temperature stable layer (1202) and the etch-stop layer (1201) and between the etch-stop layer (1201) and the first layered structure (152). The temperature stable layer (1202) is selected such that it is capable of withstanding decomposition, erosion and other destructive processes caused by high-temperature treatment during subsequent epitaxial growth on the second side (141) of the substrate (145). Typically, the temperature stable layer (1202) must withstand a temperature up to 700° C. during several hours.

Many etchants capable of providing a significant difference (for example, more than 100 times) in etching rates between III-V semiconductor materials having different anion composition, for example between arsenide-based compounds and phosphide-based compounds, are known. If the first layered structure (152) represents the layered structure (552) of FIG. 5 having a GaAs cap layer (505), then the etch-stop layer (1201) is preferably GaAsP and more preferably InGaP lattice-matched to GaAs. The temperature stable layer (1202) is preferably AlGaAs. A significant difference in etching rates is preferably achieved between AlGaAs and InGaP and between GaAs and InGaP.

Use of AlGaAs with an AlAs mole fraction in the 0.8-0.95 range as the temperature-stable layer (1202) is preferable because such a layer can withstand temperature treatment at approximately 700° C. or even higher during several hours which is the typical growth condition for the epitaxial growth of the second layered structure (151) by the MBE method. During such a treatment, a very thin surface layer of the temperature-stable layer (1202) is converted into AlAs because of re-evaporation of Ga atoms from an exposed surface. Typical width of this AlAs layer is only 1-2 nm. The remainder of the temperature stable layer (1202) remains unchanged and has its initial AlGaAs composition. In further steps, the structure is exposed to air or atmosphere containing oxygen or water vapor. The AlGaAs part of the temperature-stable layer provides necessary protection of the underlying structure against deep oxidation. When necessary the temperature-stable layer (1202) and the etch-stop layer (1201) may be etched off by two subsequent procedures of selective etching such that the protective film (302) is completely removed.

In one embodiment, via-hole conductive paths (160) form electrical connections, in several selected places, between conductive paths or metal contacts formed on the first side (142) and the second side (141) of the substrate (145).

FIGS. 6(a) to 6(h) illustrate steps in fabricating via-holes and via-hole electrical connections according to an embodiment of the present invention.

Figure 6:
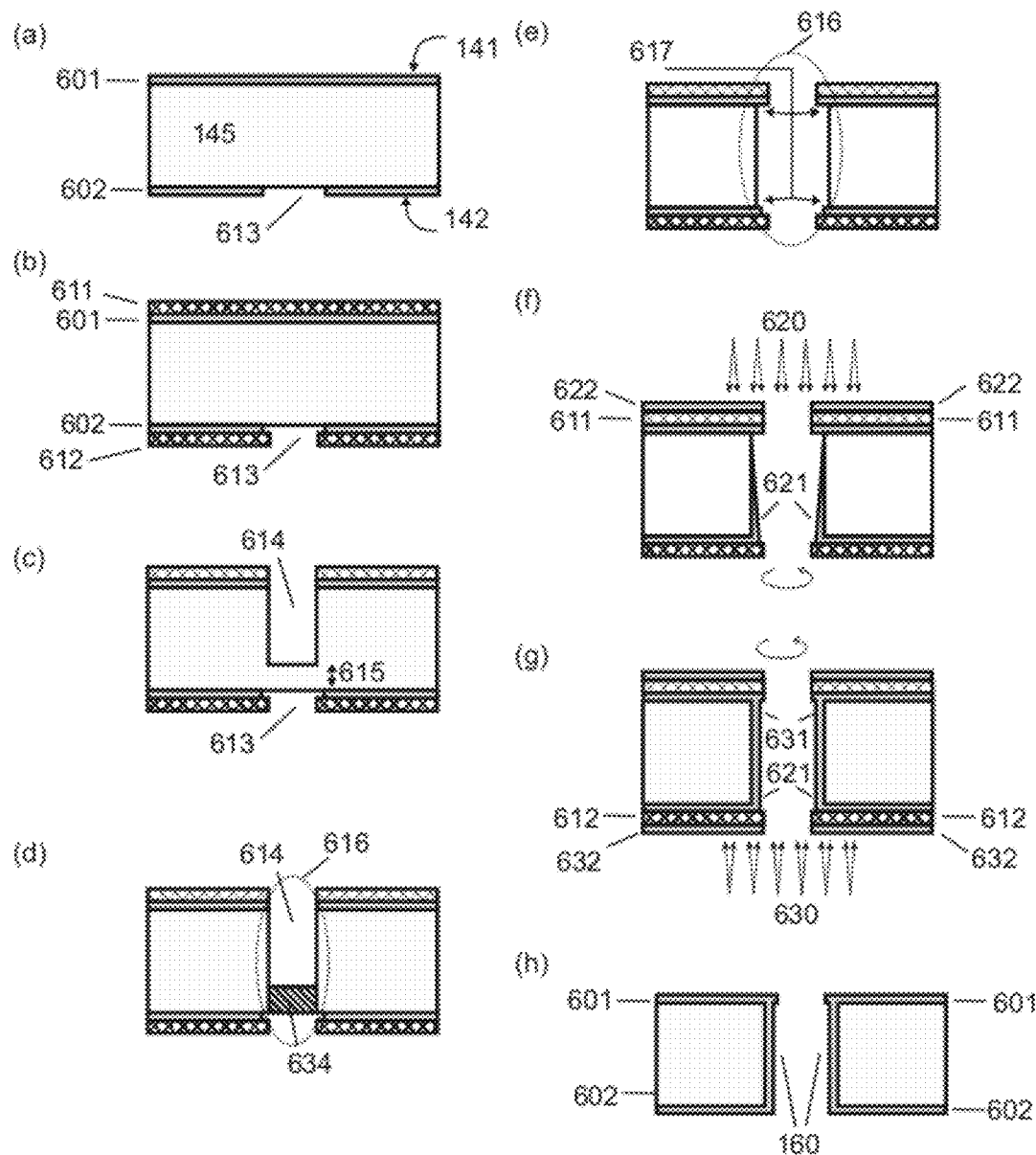
FIG. 6(a) illustrates a cross-section of a substrate near a place intended for via-hole formation in a method of the present invention.
FIG. 6(b) shows a first side and a second side of the substrate covered with a layer of resist in a method of the present invention.
FIG. 6(c) shows a locally thinned portion of the substrate where a part-through hole is formed on the second side of the substrate in a method of the present invention.
FIG. 6(d) shows a through hole formed in a method of the present invention.
FIG. 6(e) shows undercut profiles formed near the first and the second surfaces in a method of the present invention.
FIG. 6(f) shows metal atoms deposited on the second side of the substrate in a method of the present invention.
FIG. 6(g) shows metal atoms deposited on the first side of the substrate in a method of the present invention.
FIG. 6(h) shows via-hole conductive paths formed between the metal layers deposited on opposite sides of the substrate in a method of the present invention.

FIG. 6(a) illustrates a cross-section of the substrate (145), near a place intended for via-hole formation. The substrate (145) shown in the figure is a semi-insulating GaAs substrate. The diode laser (110) (not shown in FIG. 6) together with necessary conductive paths and metal contacts is already fabricated in certain locations on the second side (141). The driver circuitry (120) and preferably the temperature-sensitive element (130) (not shown in FIG. 6) are already fabricated in certain locations on the first side (142). Near a place intended for formation of the via-hole conductive path (160), the second side (141) is covered by a metal layer (601) and the first side (142) is covered by a metal layer (602). Thus, the stage of device fabrication illustrated in FIG. 6(a) corresponds to the stage illustrated in FIG. 3(f).

The place intended for formation of the via-hole conductive path (160) is designated by an opening (613) formed in one of the two metal layers (601) and (602). In the figure, the opening (613) is shown in the metal layer (602) on the first side (142), but could alternatively be located in the metal layer (601) on the second side (141). The opening (613) is located in a predetermined place intended for via-hole formation. In a plan view, the opening (613) may approximate a circle with a diameter of about 100 micrometers, or a square with a side of about 100 micrometers, or another shape such that its dimensions are suitable for subsequent stages.

In the next step, shown in FIG. 6(b), the second side (141) is covered with a layer of resist (611). The first side (142) is also covered with a layer of resist (612), except for the opening (613) formed in the metal layer (602).

As shown in FIG. 6(c), the substrate (145) is locally thinned by a mechanical method, for example by saw cutting or drilling, such that a part-through hole (614) is formed on the second side (141) just opposite the opening (613) on the first side (142). Positioning is performed using markers on the substrate surfaces (not shown in FIG. 6). A residual depth (615) of the substrate is selected to be suitable for a subsequent etching stage and may be, for example, about 100 micrometers. A depth of the part-through hole depends on the initial thickness of the substrate and is preferably a few hundred micrometers.

FIG. 6(d) shows a through hole (634) formed by a dry etching method, for example by chlorine plasma etching. As a result the part-through hole (614) is transformed into a via-hole (616) which permeates the substrate (145).

In the next step, shown in FIG. 6(e), walls of the via-hole (616) formed in the previous steps are wet etched by a suitable etchant. The etchant is preferably characterized by a high etching rate for semiconductor layers and a low etching rate for metal layers such that undercut profiles (617) are formed near the first and the second surfaces.

FIG. 6(f) shows metal atoms deposited on the second side (141). During the deposition, the substrate (145) is rotated and the substrate (145) is inclined with respect to a flux (620) of metal atoms, such that a metal layer (621) is formed on the side walls of the via-hole (616). In addition, a metal layer (622) is formed atop the resist layer (611). The inclination angle is selected such that at least half the depth of the via-hole (616) is covered with the metal layer (621).

FIG. 6(g) shows metal atoms deposited on the first side (142). During the deposition, the substrate (145) is rotated and the substrate (145) is inclined with respect to a flux (630) of metal atoms, such that a metal layer (631) is formed on the side walls of the via-hole (616) in addition to a metal layer (632) formed atop the resist layer (612). The inclination angle is selected such that at least half the depth of the via-hole (616) is covered with the metal layer, such that the side walls of the via-hole (616) are completely covered with metal layers (621) and (631).

In a final step shown in FIG. 6(h), the resist layers (611) and (612) together with the overlaying metal layers (622) and (632) are removed while the metal layers (621) and (631) deposited on the side walls remain such that the via-hole conductive path (160) is formed between the metal layers (601) and (602) deposited on opposite sides of the substrate (145).

FIGS. 15(a) through 15(h) illustrate steps in fabricating via-holes and via-hole electrical connections according to another embodiment of the present invention.

Figure 15:
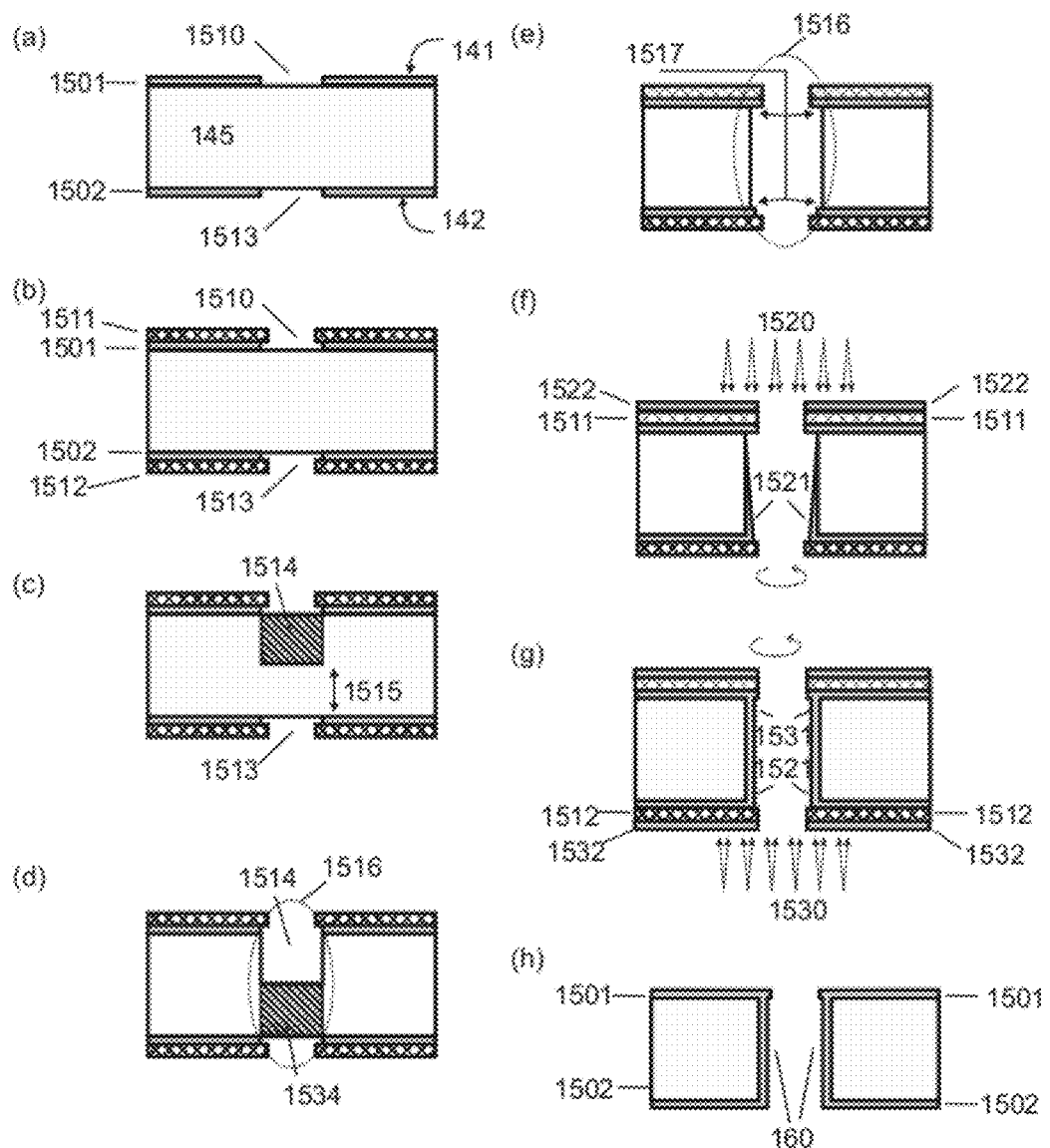
FIG. 15(a) illustrates a cross-section of a substrate near a place intended for via-hole formation in a method of the present invention.
FIG. 15(b) shows a first side and a second side of the substrate covered with a layer of resist in a method of the present invention.
FIG. 15(c) shows a locally thinned portion of the substrate where a part-through hole is formed on the second side of the substrate in a method of the present invention.
FIG. 15(d) shows a through hole formed in a method of the present invention.
FIG. 15(e) shows undercut profiles formed near the first and the second surfaces in a method of the present invention.
FIG. 15(f) shows metal atoms deposited on the second side of the substrate in a method of the present invention.
FIG. 15(g) shows metal atoms deposited on the first side of the substrate in a method of the present invention.
FIG. 15(h) shows via-hole conductive paths formed between the metal layers deposited on opposite sides of the substrate in a method of the present invention.

FIG. 15(a) illustrates a cross-section of the substrate (145), near a place intended for via-hole formation. The substrate (145) shown in the figure is a semi-insulating GaAs substrate. The diode laser (110) (not shown in FIG. 15) together with necessary conductive paths and metal contacts is already fabricated in certain locations on the second side (141). The driver circuitry (120) and preferably the temperature-sensitive element (130) (not shown in FIG. 15) are already fabricated in certain locations on the first side (142). Near a place intended for formation of the via-hole conductive path (160), the second side (141) is covered by a metal layer (1501) and the first side (142) is covered by a metal layer (1502). Thus, the stage of device fabrication illustrated in FIG. 15(a) corresponds to the stage illustrated in FIG. 3(f).

The place intended for formation of the via-hole conductive path (160) is designated by two openings (1510) and (1513) formed in the metal layers (1501) and (1502), respectively. The openings (1510) and (1513) are located on two opposite sides of the substrate (145) just opposite each other in a predetermined place intended for via-hole formation. Mutual positioning is performed using markers on the substrate surfaces (not shown in FIG. 15). In a plan view, the openings (1510) and (1513) may approximate a circle with a diameter of about 100 micrometers, or a square with a side of about 100 micrometers, or another shape such that its dimensions are suitable for subsequent stages.

In the next step, shown in FIG. 15(b), the second side (141) is covered with a layer of resist (1511), except for the opening (1510) formed in the metal layer (1501). The first side (142) is also covered with a layer of resist (1512), except for the opening (1513) formed in the metal layer (1502).

As shown in FIG. 15(c), a part-through hole (1514) is formed on the second side (141) of the substrate (145) just opposite the opening (1513) on the first side (142). The part-through hole (1514) is preferably formed by a dry etching method, for example by chlorine plasma etching. A residual depth (1515) of the substrate is selected to be suitable for a subsequent etching stage and may be, for example, from 100 to 300 micrometers. A depth of the part-through hole depends on the initial thickness of the substrate and may be, for example, from 100 to 300 micrometers.

FIG. 15(d) shows a through hole (1534) formed by a dry etching method, similar to the method of FIG. 15(c). As a result the part-through hole (1514) is transformed into a via-hole (1516), which permeates the substrate (145).

Other steps, illustrated in FIGS. 15(e) to 15(h), in fabricating via-hole electrical connections according to this embodiment of the present invention are similar to the steps illustrated in FIGS. 6(e) to 6(h).

In the next step, shown in FIG. 15(e), walls of the via-hole (1516) formed in the previous steps are wet etched by a suitable etchant. The etchant is preferably characterized by a high etching rate for semiconductor layers and a low etching rate for metal layers such that undercut profiles (1517) are formed near the first and the second surfaces.

FIG. 15(f) shows metal atoms deposited on the second side (141). During the deposition, the substrate (145) is rotated and the substrate (145) is inclined with respect to a flux (1520) of metal atoms, such that a metal layer (1521) is formed on the side walls of the via-hole (1516). In addition, a metal layer (1522) is formed atop the resist layer (1511). The inclination angle is selected such that at least half the depth of the via-hole (1516) is covered with the metal layer (1521).

FIG. 15(g) shows metal atoms deposited on the first side (142). During the deposition, the substrate (145) is rotated and the substrate (145) is inclined with respect to a flux (1530) of metal atoms, such that a metal layer (1531) is formed on the side walls of the via-hole (1516) in addition to a metal layer (1532) formed atop the resist layer (1512). The inclination angle is selected such that at least half the depth of the via-hole (1516) is covered with the metal layer, such that the side walls of the via-hole (1516) are completely covered with metal layers (1521) and (1531).

In a final step shown in FIG. 15(h), the resist layers (1511) and (1512) together with the overlaying metal layers (1522) and (1532) are removed while the metal layers (1521) and (1531) deposited on the side walls remain such that a via-hole conductive path (160) is formed between the metal layers (1501) and (1502) deposited on opposite sides of the substrate (145).

The method of fabricating via-holes, illustrated in FIGS. 6(a) to 6(h), involves a mechanical thinning of the substrate, for example by saw cutting or drilling. Therefore the substrate depth intended for dry etching can be relatively thin. This method is preferably used if the optoelectronic module includes a single diode laser. The method of fabricating via-holes, illustrated in FIGS. 15(a) to 15(h), does not involves a mechanical thinning of the substrate and preferably completely relies on dry etching. This method is better suited if the optoelectronic module includes an array of diode lasers.

The diode laser (110) is preferably intended for use in optical communication systems. In one preferred embodiment, the driver circuitry (120) produces the drive electrical signal (125) including two components, (701) and (702). These two components (701) and (702) preferably act simultaneously. A first component, a bias current (701), is a DC current having a magnitude $I_{bias}$. The bias current (701) may bias the laser close to the threshold current (711) of the diode laser (110), for example slightly above the threshold current (711). A second current component, a modulation current (702), is a variable current having an amplitude $I_{mod}$. The modulation current (702) is preferably in two levels, for example at zero level or at $I_{mod}$ level. The total drive current is preferably at level $I_{bias}$ or at level ($I_{bias}+I_{mod}$), while the optical output power of the diode laser is preferably in two output states (721) and (722). Curve (725) schematically illustrates a temporal variation of the drive electrical signal (125), while curve (726) schematically illustrates a temporal variation of the optical output power. The modulation current (702) is a variable component. Thus curve (725) shows the driver signal in different moments of time, while curve (726) shows the corresponding output power in different moments.

Figure 7:
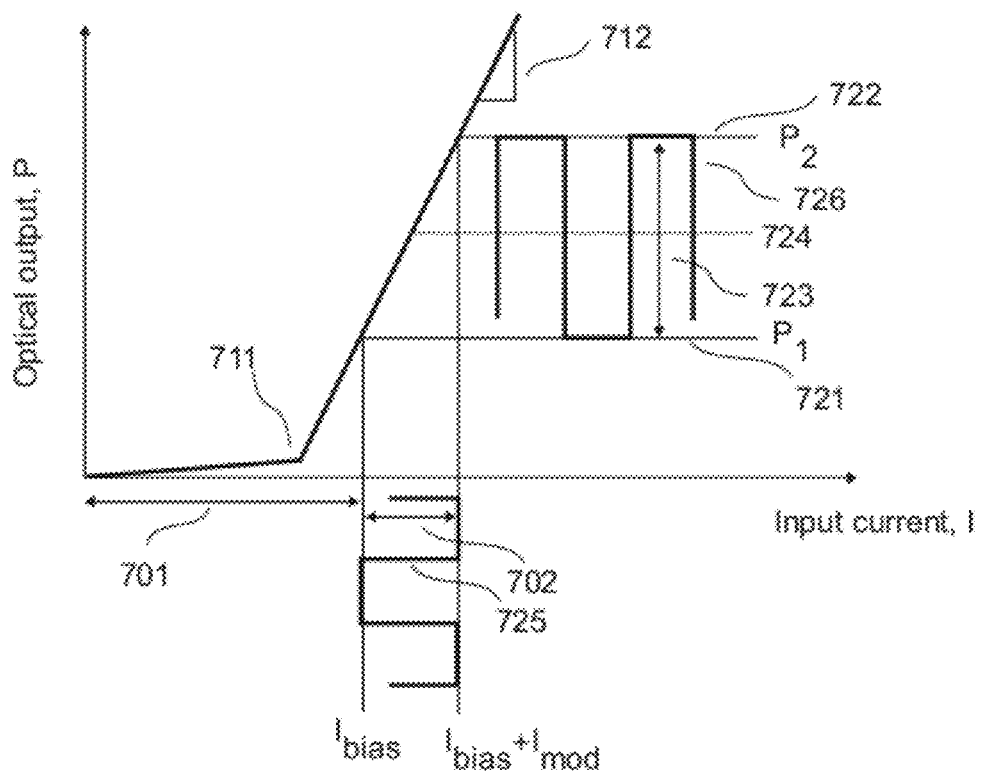
FIG. 7 shows a light-current characteristic of a diode laser and illustrates a method for modulation of the laser output according to an embodiment of the present invention.

A first output state (721) corresponds to the output power $P_1$ in response to the bias current $I_{bias}$ only. A second output state (722) corresponds to the output power $P_2$ in response to the bias current $I_{bias}$ plus the modulation current $I_{mod}$ jointly. The temporal variation of the modulation current (702) corresponds to the required data pattern. As shown in FIG. 7, the amplitude $I_{mod}$ of the modulation current (702) determines the optical modulation amplitude (723) of the diode laser which is equal to ($P_2-P_1$). The magnitude $I_{bias}$ of the bias current (701) jointly with the amplitude $I_{mod}$ of the modulation current (702) determines the average optical power (724) of the diode laser.

Figure 8:
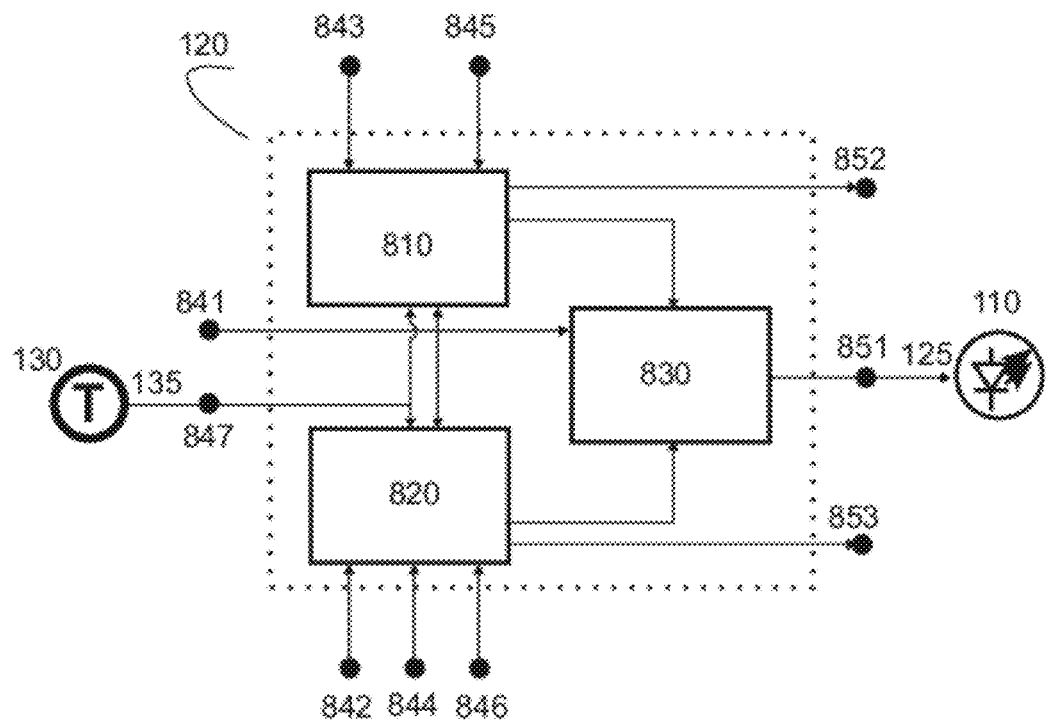
FIG. 8 shows a principle scheme of the driver circuitry according to an embodiment of the present invention.

FIG. 8 shows in more detail an example of the driver circuitry (120) according to an embodiment of the present invention. In general, the driver circuitry (120) includes a bias generator unit (810), a modulation generator unit (820), and a drive mixer unit (830). The driver circuitry (120) preferably has the following electrical terminals: a power supply input (841), a data input (842), a bias set input (843), a modulation set input (844), a bias temperature coefficient input (845), a modulation temperature coefficient input (846), a temperature control input (847), a drive output (851), a bias monitor output (852), and a modulation monitor output (853).

The power supply input (841) accepts electrical power from an external power supply unit (not shown in FIG. 8) and feeds the units (810), (820), and (830) of the driver circuitry (120).

The data input (842) accepts a data pattern and delivers the data pattern to the modulation generator unit (820).

The bias set input (843) accepts a bias set signal from an external control unit (not shown in FIG. 8) and delivers the bias set signal to the bias generator unit (810).

The bias temperature coefficient input (845) accepts a bias temperature coefficient signal from an external control unit (not shown in FIG. 8) and delivers the bias temperature coefficient signal to the bias generator unit (810).

The modulation set input (844) accepts a modulation set signal from an external control unit (not shown in FIG. 8) and delivers the modulation set signal to the modulation generator unit (820).

The modulation temperature coefficient input (846) accepts a modulation temperature coefficient signal from an external control unit (not shown in FIG. 8) and delivers the modulation temperature coefficient signal to the modulation generator unit (820).

The temperature control input (847) accepts the temperature-dependent control signal (135) from the temperature-sensitive element (130) and delivers the temperature-dependent control signal (135) to the bias generator unit (810) and the modulation generator unit (820).

The bias generator unit (810) generates a DC bias current (701) with the magnitude $I_{bias}$. The bias generator unit (810), in response to the temperature dependent control signal (135), changes the magnitude of the bias current in linear relation to the temperature T measured by the temperature-sensitive element (130) such that $$I_{bias}(T)=I_{bias}(25° C.)+(T-25° C.)*TC_{bias} \qquad \text{(Eq. 1)}$$

The magnitude of the bias current (701) at a temperature of 25 degrees, $I_{bias}(25° C.)$, is set by the bias set signal. The temperature coefficient of the bias current (701), $TC_{bias}$, is set by the bias temperature coefficient signal.

The bias generator unit (810) may also generate a bias monitor signal (for example a DC voltage signal) and delivers the bias monitor signal to the bias monitor output (852). The magnitude of the bias monitor signal is preferably in known relation (for example in linear proportion) with the magnitude of the bias current (701). The bias monitor output (852) may be used for external monitoring of the operation of the driver circuitry (120).

The modulation generator unit (820) generates a modulation current (702) in accordance with the accepted data pattern, the modulation current (702) having the amplitude $I_{mod}$. The modulation generator unit (820), in response to the temperature dependent control signal (135), changes the amplitude of the modulation current in linear relation to the temperature T measured by the temperature-sensitive element (130) such that $$I_{mod}(T)=I_{mod}(25° C.)+(T-25° C.)*TC_{mod} \qquad \text{(Eq. 2)}$$

The amplitude of the modulation current (702) at a temperature of 25 degrees, $I_{mod}(25° C.)$, is set by the modulation set signal. The temperature coefficient of the modulation current (702), $TC_{mod}$, is set by the modulation temperature coefficient signal.

The modulation generator unit (820) may also generate a modulation monitor signal (for example a DC voltage signal) and delivers the modulation monitor signal to the modulation monitor output (853). The magnitude of the modulation monitor signal is in known relation (for example in linear proportion) with the amplitude of the modulation current (702). The modulation monitor output (853) may be used for external monitoring of the operation of the driver circuitry (120).

The drive mixer (830) accepts the DC bias current (701) from the bias generator unit (810), accepts the modulation current (702) from the modulation generator unit (820), superimposes the DC bias current (701) and the modulation current (702), and delivers the resulting temperature-variable drive current (125) to the drive output (851). The drive output (851) further supplies the drive current (125) to the diode laser (110).

The magnitude of the bias current (701) at 25° C. and the amplitude of the modulation current (702) at 25° C., $I_{bias}$(25° C.) and $I_{mod}$(25° C.), respectively, are selected such that the diode laser (110) generates an optical output (115) with the required average output power (724) and the required optical modulation amplitude (723) suitable for further use in an optical communication system or other specific purposes. $I_{bias}$(25° C.) and $I_{mod}$(25° C.) are preferably changeable in the range of 0.5-20 mA.

The temperature coefficient of the bias current (701) and the temperature coefficient of the modulation current (702), $TC_{bias}$ and $TC_{mod}$, are selected such that the average output power (724) and the optical modulation amplitude (723) in the optical output (115) of the diode laser (110) remains stable within approximately 5% or less in the 25-85° C. interval of the ambient temperature. $TC_{bias}$ and $TC_{mod}$ are preferably changeable in the range of 0-100 μA/° C. (microamperes per degree centigrade).

The aforementioned external control units, which provide the bias set signal, the bias temperature coefficient signal, the modulation set signal, and the modulation temperature coefficient signal, are preferably combined in a single external control unit in an embodiment of the present invention.

Internal parameters of the diode laser (for example, threshold current (711), slope efficiency (712) and their temperature dependences) and the internal parameters of the microelectronic components which constitute the driver circuitry (120) (for example, resitivities) determine the appropriate values of $I_{bias}$(25° C.), $I_{mod}$(25° C.), $TC_{bias}$, and $TC_{mod}$, which are required for proper operation of the optoelectronic module (100) as a whole. These internal parameters are expected to be varied from module to module. This dispersion of the internal parameters motivates a need for the external signals, which set the values of $I_{bias}$(25° C.), $I_{mod}$(25° C.), $TC_{bias}$, and $TC_{mod}$.

However, in mass production of optoelectronic modules, the internal parameters are very stable from module to module. In this situation it is preferred that typical values of $I_{bias}$(25° C.), $I_{mod}$(25° C.), $TC_{bias}$, and $TC_{mod}$ are already preset by the internal electronics of the driver circuitry (120). The signals from the external control units are preferably used to finely tune the values of $I_{bias}$(25° C.), $I_{mod}$(25° C.), $TC_{bias}$, and $TC_{mod}$ if the internal parameters of a given lot of optoelectronic modules differ from the typical internal parameters. In certain situations and depending on requirements of the optoelectronic module, it is possible to avoid the fine tuning of the values of $I_{bias}$(25° C.), $I_{mod}$(25° C.), $TC_{bias}$, and $TC_{mod}$.

More specifically, the bias generator unit (810) (as well as the modulation generator unit (820)) may include a differential amplifier which accepts to its first input the temperature-dependent control signal (135) from the temperature-sensitive element (130) and accepts to its second input a temperature independent control signal from a reference signal source.

The temperature-sensitive element (130) may be, but is not limited to, a Schottky diode, a p-n diode, or a semiconductor thin film resistor formed from selected layers of the first layered structure (152) or the second layered structure (151). The temperature-sensitive element (130) is preferably placed in close proximity (in thermal contact) to the diode laser (110). For example, the temperature-sensitive element (130) may be located just below the diode laser (120) on the first side (142) of the substrate. The reference signal source may have the same structure as the temperature-sensitive element (130). However, the reference signal source is preferably located as far as possible from the diode laser (110). The temperature dependent signal (135) as well as the temperature independent signal may represent a DC voltage drop from the corresponding structural element.

In one preferred embodiment the temperature-sensitive element (130) and the reference signal source are fabricated on the first side (142) of the substrate simultaneously with the fabrication of the driver circuitry (120). The temperature-sensitive element (130) and the reference signal source preferably represent Schottky diodes made of selected layers of the first layered structure (152). The temperature-sensitive element (130) is located on the first side (142) of the substrate just below the diode laser (110) formed on the second side (141). The reference signal source is preferably located at least 5 mm from the temperature-sensitive element (130).

Figure 9:
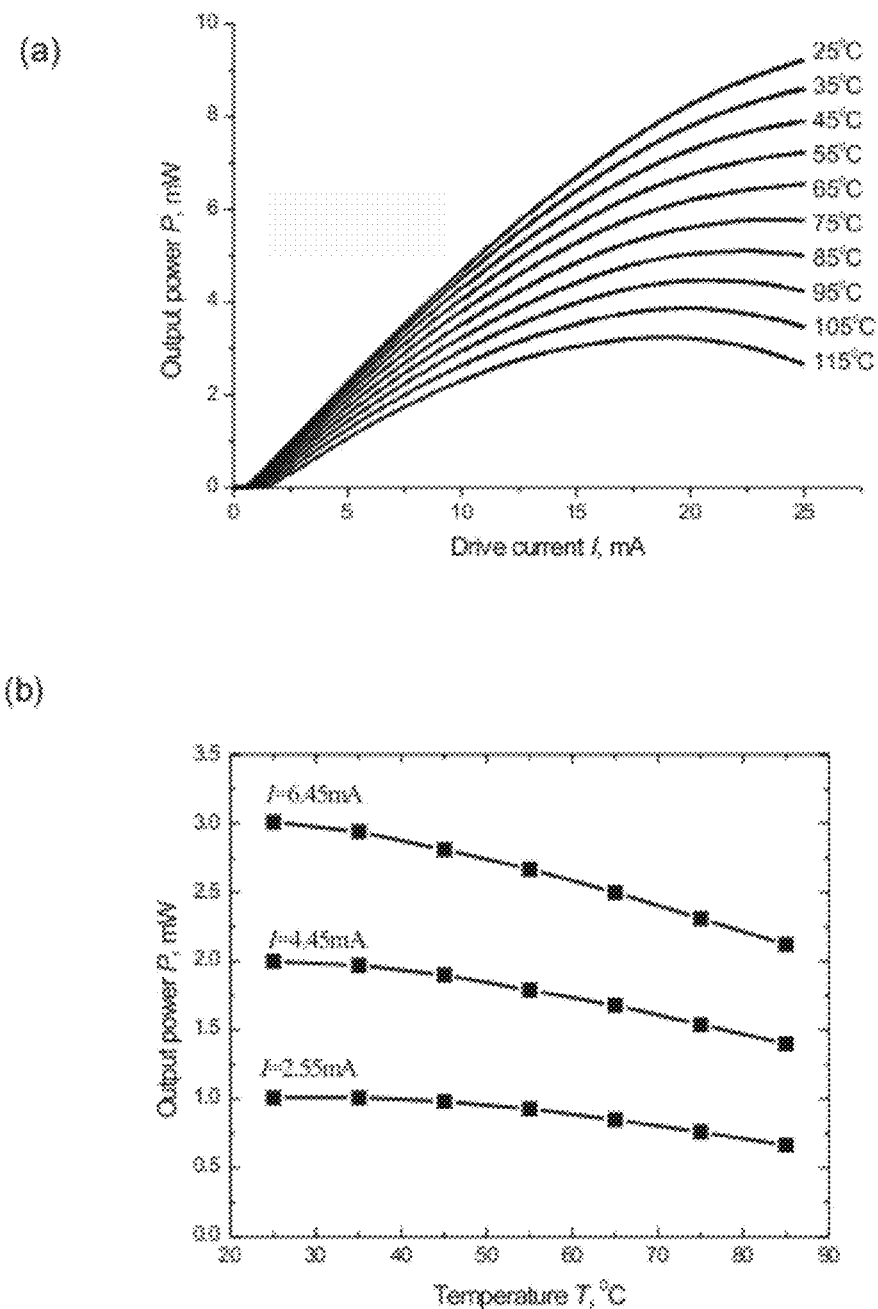
FIG. 9(a) shows light-current characteristics of a VCSEL module, fabricated in accordance with an embodiment of the present invention, operating at different temperatures without temperature compensation.
FIG. 9(b) shows temperature variation of the output power of the VCSEL module, fabricated in accordance with an embodiment of the present invention, operating at constant drive currents without temperature compensation.

FIG. 9(a) illustrates a temperature variation of the light-current curve for a typical VCSEL structure (410) fabricated in accordance with the present invention. The graph shows 10 degree increments from 25° C. to 115° C. The threshold current gradually increases and the slope efficiency gradually decreases as the ambient temperature increases above room temperature. As a result, the VCSEL (410) provides less output power if the drive current is set constant over the temperature interval.

For example, FIG. 9(b) illustrates the variation of the output power in the 25-85° C. temperature interval at three different constant drive currents of 2.55, 4.45, and 6.45 mA. The initial (at 25° C.) output power of 1, 2, or 3 mW decreases down to 0.664, 1.4 or 2.12 mW, respectively when the temperature is increased to 85° C. Thus, the initial power level decreases by approximately 30% if the drive current is kept constant. Therefore, the average output power and the optical modulation amplitude also decreases by approximately 30% in the 25-85° C. temperature interval if no temperature compensation is provided.

If temperature-independent optical output is required, the drive current I should gradually increase as the temperature increases as it is illustrated by solid squares in FIG. 10(a) for three different levels of the output power P (1, 2, or 3 mW). Within a certain temperature interval of interest (25° C.-85° C.), the temperature variation of the required bias current can be fitted with acceptable accuracy by a linear function similar to Eq. 1 and Eq. 2, as illustrated by dashed lines. The rate of temperature variation TC of the required drive current is 14.5, 27.5, or 45 μA/° C. for P=1, 2, or 3 mW, respectively.

FIG. 10(b) illustrates that the use of temperature compensation with an appropriate linear variation of the drive current results in stable optical power within approximately 5% in the 25-85° C. temperature interval. Therefore, the average output power and the optical modulation amplitude are also stable within approximately 5% in the 25-85° C. temperature interval if the bias current and the modulation current are appropriately temperature compensated.

FIG. 13(a) illustrates a temperature variation of the light-current curve for another VCSEL structure (410) fabricated in accordance with the present invention. The graph shows 10 degree increments from 25° C. to 115° C. FIG. 13(b) shows temperature variation of the drive current (solid symbols) required to reach an output power of 2 mW. Within the 25-95° C. temperature interval, the temperature variation of the required bias current can be fitted with acceptable accuracy by a linear function similar to Eq. 1 and Eq. 2, as illustrated by dashed lines. The rate of temperature variation TC of the required drive current is 12.2 µA/° C. FIG. 13(c) shows temperature variation of the output power of the VCSEL operating with temperature compensation. The use of temperature compensation with an appropriate linear variation of the drive current results in stable optical power within approximately 4% in the 25-95° C. temperature interval. Therefore, the average output power and the optical modulation amplitude are also stable within approximately 4% in the 25-95° C. temperature interval if the bias current and the modulation current are appropriately temperature compensated.

Figure 11:
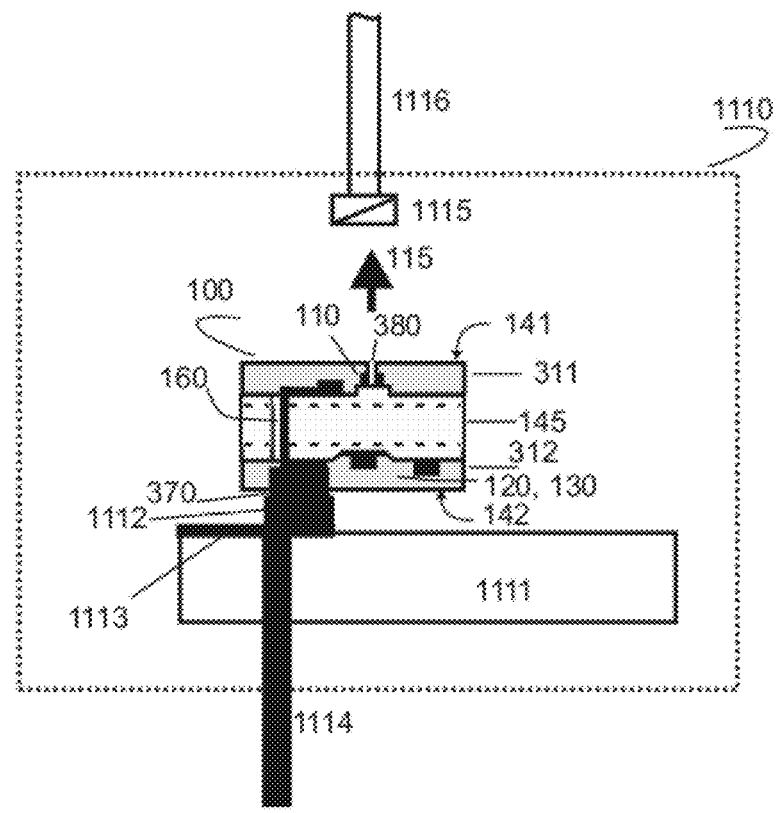
FIG. 11(a) illustrates a cross-sectional view of a packaged optoelectronic module according to an embodiment of the present invention.
FIG. 11(b) illustrates a cross-sectional view of a packaged optoelectronic module according to another embodiment of the present invention.
Figure 11:
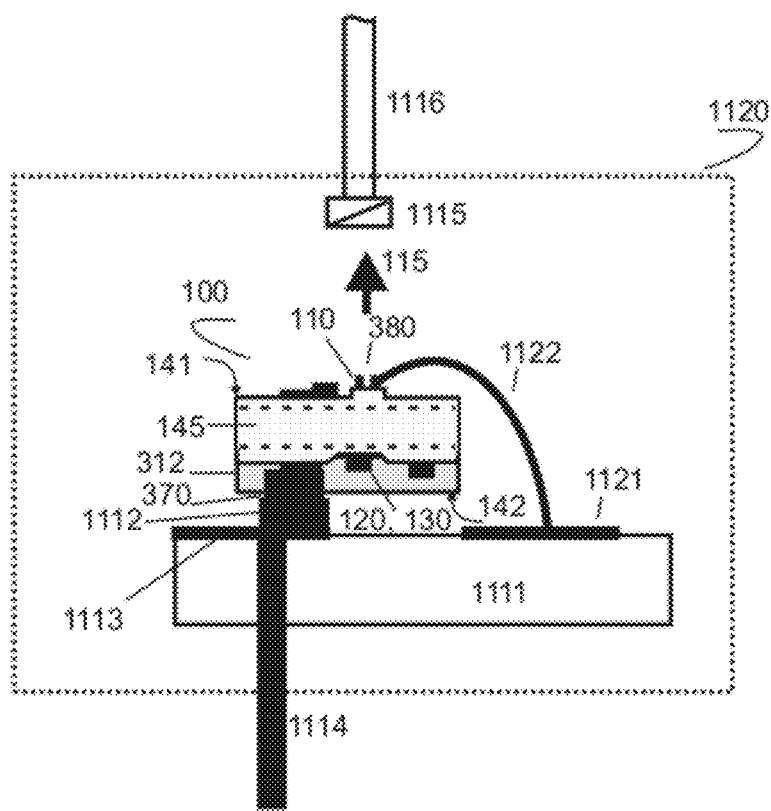

FIG. 11(a) schematically illustrates, in cross-sectional view, a packaged (1110) optoelectronic module (100) in accordance with an embodiment of the present invention. The double-sided monolithically integrated optoelectronic module (100) includes the diode laser (110) fabricated on the second side (141) of the substrate (145) and the driver circuitry (120) fabricated on the first side (142) of the substrate (145). The optoelectronic module (100) further includes the temperature-sensitive element (130) fabricated on the first side (142) of the substrate (145). Via-hole conductive paths (160) provide electrical connections between the diode laser (110) and the electronic components (110) and (130) fabricated on different sides (141) and (142) of the substrate (145).

The first side (142) is protected by the dielectric coating (312) in which the conductive pads (370) are formed in several predetermined places. The second side (141) is protected by the dielectric coating (311) having the output aperture (380) suitable for outputting the optical output (115).

The package (1110) includes a dielectric submount (1111). The submount (1111) preferably has conductive bumps (1112) in several predetermined places, which can correspond to the location of the conductive pads (370) on the optoelectronic module (100). The optoelectronic module (100) is preferably flip-chip bonded by the first side (142) to the submount (1111) such that the conductive pads (370) and the conductive bumps (1112) are aligned. The conductive pads (370) and the conductive bumps (1112) are preferably made sufficiently large in area so that the module (100) and the submount (1111) are easily aligned for the flip-chip bonding.

The submount acts (1111) as a bearing element and also provides a necessary electrical connection (1113) between the optoelectronic module (100) and the contact pins (1114) of the package (1110).

The package (1110) may further include coupling optics (1115) for coupling the optical output (115) to a single-mode fiber pigtail (1116).

FIG. 11(b) schematically illustrates, in cross-sectional view, a packaged (1120) optoelectronic module (100) in accordance with another embodiment of the present invention. The main difference from the embodiment shown in FIG. 11(a) is that there is no via-hole conductive path through the substrate (145) of the optoelectronic module (100). The necessary electrical connections between the diode laser (110) fabricated on the second side (141) of the substrate (145) and the electronic components (120) and (130) fabricated on the first side (142) of the substrate (145) are provided by additional conductive paths (1121) made on the submount (1111) and the wires (1122) (not all of the electrical connections are shown).

The method of the present invention may also be used if the diode laser represents a laser array, for example an array of VCSELs, rather than a single laser. Use of a double-sided monolithically integrated optoelectronic module including a laser array and a corresponding driver circuitry may be advantageous for use in optical interconnection systems.

Figure 14:
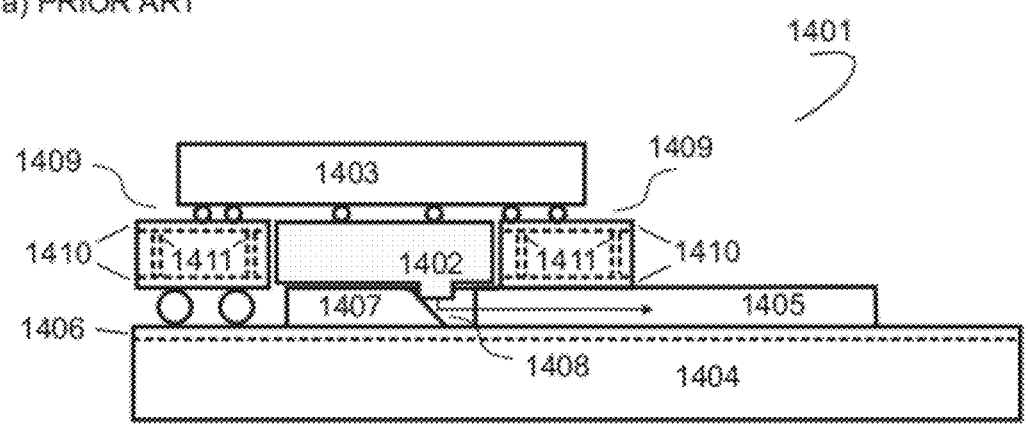
FIG. 14(a) illustrates a structure of an optoelectronic transmitter according to a prior art method.
FIG. 14(b) illustrates a structure of an optoelectronic transmitter according to an embodiment of the present invention.
Figure 14:
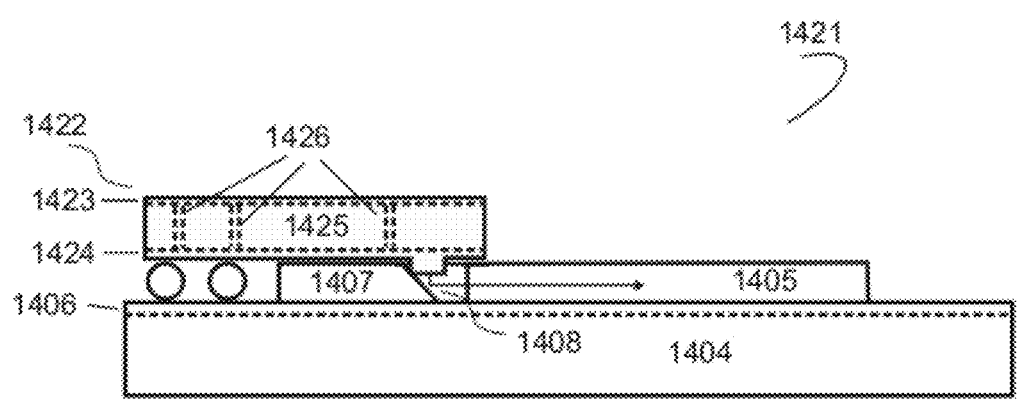

J. A. Kash, et al. in "Chip-to-chip optical interconnects" [OFC/NFOEC Technical Conference 2006 (Mar. 5-10, 2006, Anaheim, Calif., USA) Paper OFA3] describe an optoelectronic transmitter (1401) which can be used for optical interconnects, as illustrated in FIG. 14(a). The optoelectronic transmitter (1401) is based on an array of VCSELs (1402) that is flip-chip bonded to a multichannel laser driver integrated circuit (1403). The array (1402) is assembled directly onto an organic card (1404) including integrated parallel waveguides (1405) and electrical connections (1406). Coupling mirrors (1407) are used to couple the output light (1408) emitted by the VCSEL array (1402) into the waveguides (1405).

The driver IC (1403) is flip-chip attached onto silicon carriers (1409). The silicon carrier (1409) includes double-sided multilayer wiring (1410) and via-hole connections (1411). The silicon carriers (1409) are used in order to integrate and electrically connect all components of the transmitter module (1401), such as the VCSEL array (1402), the driver IC (1403), and the card (1404). Proper alignment of several heterogeneous components is a time-consuming operation.

A doubled-sided monolithically integrated optoelectronic module fabricated in accordance with the present invention can replace several components in the structure of an optoelectronic transmitter. FIG. 14(b) illustrates an optoelectronic transmitter (1421) including a doubled-sided monolithically integrated optoelectronic module (1422) including driver circuitry (1423) and an array of diode lasers (1424) fabricated on different sides of the substrate (1425). The array (1424) and the driver circuitry (1423) are electrically connected by via-hole connections (1426).

The optoelectronic module (1422) shown in FIG. 14(b) replaces the VCSEL array (1402), the driver IC (1403), and the carriers (1409) illustrated in FIG. 14(a). Thus, use of the doubled-sided monolithically integrated optoelectronic module significantly simplifies the optoelectronic transmitter structure compared to prior art methods and, therefore, is time- and cost-effective.

Thus, the optoelectronic module of the present invention combines advantages of a diode laser monolithically integrated with driver circuitry in a single semiconductor substrate and advantages of a diode laser operating with a temperature compensation regime. The FET-based driver circuitry and the diode laser itself may be designed for high-speed operation. Close proximity between the device's parts enables high-density packaging, ensures precise temperature monitoring, and can improve high-speed characteristics due to low series resistance, low cross-talks, and high-speed electronic components. One prospective advantage is that the approach is fully compatible with mass-production technology. The process can readily be scaled as the wafer size increases with minor modification. Another advantage of the method of the present invention is a reduction of chip area compared to location of the diode laser and the driver circuitry at the same side of the substrate.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of fabricating an optoelectronic module comprising a substrate having a first side and a second side, comprising the steps of:
   a) depositing a first layered structure on the first side of the substrate;
   b) depositing a protective film on the first layered structure;
   c) depositing a second layered structure on the second side of the substrate;
   d) removing the protective film; and
   e) forming at least one via-hole to electrically connect the first layered structure and the second layered structure;
   wherein the conditions of step a) and step b) are selected such that the second side of the substrate remains stable during these steps; and
   wherein the protective film is selected such that it protects the first layered structure from degradation during step c).

2. The method of claim 1, wherein step d) further comprises the substep of selectively etching the protective film off of the first layered structure.

3. The method of claim 2, wherein the substep of selectively etching the protective film comprises at least two rounds of selective etching such that the protective film is completely removed.

4. The method of claim 1, wherein the protective film protects the first layered structure against decomposition, erosion and other destructive processes which can be caused by high-temperature treatment during step c).

5. The method of claim 1, wherein the substrate is a double-sided epi-ready substrate made of a III-V semiconductor material.

6. The method of claim 1, further comprising, between steps c) and d), the step of forming a diode laser from the second layered structure.

7. The method of claim 6, further comprising, after step d), the step of forming driver circuitry from the first layered structure.

8. The method of claim 1, further comprising, between steps c) and d), the step of forming a temperature-sensitive element from the second layered structure.

9. The method of claim 1, further comprising, after step d), the step of forming driver circuitry from the first layered structure.

10. The method of claim 1, further comprising, after step d), the step of forming a temperature-sensitive element from the first layered structure.

11. The method of claim 1, wherein the step of forming at least one via-hole comprises the substeps of:
    i) forming at least one metal layer on the first side of the substrate and at least one metal layer on the second side of the substrate wherein one of the metal layers has an opening in a location intended for via-hole formation;
    ii) forming at least one resist layer on each side of the substrate such that all of the metal layers are covered with the resist layers except at the opening;
    iii) forming a part-through hole on the side of the substrate that is opposite the opening;
    iv) transforming the part-through hole into a via-hole permeating the substrate;
    v) forming at least one undercut profile;
    vi) depositing a plurality of metal atoms on one side of the substrate and on side walls of the via-hole, wherein the substrate is rotated and the substrate is inclined with respect to a flux of the metal atoms, wherein the inclination angle is selected such that at least half a depth of the via-hole is covered with the metal atoms;
    vii) depositing a plurality of metal atoms on the other side of the substrate and on side walls of the via-hole, wherein the substrate is rotated and the substrate is inclined with respect to a flux of metal atoms, wherein the inclination angle is selected such that the side walls of the via-hole are completely covered with the metal atoms; and
    viii) removing the resist layer and the metal atoms overlaying the resist layer.

12. The method of claim 11, wherein the part-through hole formed in substep iii) is formed by mechanical thinning.

13. The method of claim 11, wherein the part-through hole is transformed into a via-hole in substep iv) by dry etching through the opening.

14. The method of claim 11, wherein the undercut profile in substep v) is formed by wet etching.

15. The method of claim 1, wherein the step of forming at least one via-hole comprises the substeps of:
    i) forming at least one metal layer on the first side of the substrate and at least one metal layer on the second side of the substrate wherein each metal layer has an opening located on two opposite sides of the substrate opposite each other in a place intended for via-hole formation;
    ii) forming at least one resist layer such that all of the metal layers are covered with the resist layer except at the openings;
    iii) forming a part-through hole on one side of the substrate;
    iv) transforming the part-through hole into a via-hole permeating the substrate;
    v) forming at least one undercut profile;
    vi) depositing a plurality of metal atoms on one side of the substrate and on side walls of the via-hole, wherein the substrate is rotated and the substrate is inclined with respect to a flux of the metal atoms, wherein the inclination angle is selected such that at least half a depth of the via-hole is covered with the metal atoms;
    vii) depositing a plurality of metal atoms on another side of the substrate and on side walls of the via-hole, wherein the substrate is rotated and the substrate is inclined with respect to a flux of metal atoms, wherein the inclination angle is selected such that the side walls of the via-hole are completely covered with metal atoms; and
    viii) removing the resist layers and the metal atoms overlaying the resist layers.

16. The method of claim 15, wherein the part-through hole in substep iii) is formed by dry etching through the opening on one side of the substrate.

17. The method of claim 15, wherein the part-through hole is transformed into a via hole in substep iv) by dry etching through the opening on a side of the substrate opposite the part-through hole.

18. The method of claim 15, wherein the undercut profile in substep v) is formed by wet etching.

19. The method of claim 9, wherein the driver circuitry is based on III-V field-effect transistors.

20. The method of claim 6, wherein the diode laser is a vertical cavity surface emitting laser.

21. A method of fabricating an optoelectronic module comprising a substrate having a first side and a second side, comprising the steps of:
    a) depositing a first layered structure on the first side of the substrate;
    b) depositing a second layered structure on the second side of the substrate;
    c) fabricating a driver circuitry from the first layered structure; and d) fabricating a diode laser from the second layered structure;

wherein the driver circuitry and the diode laser are monolithically integrated such that the optoelectronic module is a double-sided monolithically integrated optoelectronic module;

wherein the driver circuitry produces a drive electrical signal supplied to the diode laser; and wherein the diode laser produces an optical output in response to the drive electrical signal.

22. The method of claim 21, further comprising the step of fabricating a temperature-sensitive element from the second layered structure.

23. The method of claim 21, further comprising the step of fabricating a temperature-sensitive element from the first layered structure.

24. The method of claim 21, further comprising, the step of forming at least one via-hole to electrically connect the first layered structure and the second layered structure.

25. The method of claim 21 wherein the first layered structure and the second layered structure comprise III-V semiconductor materials.

26. The method of claim 21, wherein step a) is performed by a method of deposition selected from the group consisting of molecular beam epitaxy and metal organic chemical vapor deposition.

27. The method of claim 21, wherein step b) is performed by a method of deposition selected from the group consisting of molecular beam epitaxy and metal organic chemical vapor deposition.

28. The method of claim 1 wherein the first layered structure and the second layered structure comprise III-V semiconductor materials.

29. The method of claim 1, wherein step a) is performed by a method of deposition selected from the group consisting of molecular beam epitaxy and metal organic chemical vapor deposition.

30. The method of claim 1, wherein step c) is performed by a method of deposition selected from the group consisting of molecular beam epitaxy and metal organic chemical vapor deposition.

31. A method of fabricating an optoelectronic module comprising a substrate having a first side and a second side, comprising the steps of:
   a) depositing a first layered structure on the first side of the substrate;
   b) depositing a protective film on the first layered structure;
   c) depositing a second layered structure on the second side of the substrate;
   d) forming a diode laser from the second layered structure; and
   e) removing the protective film;
   wherein the conditions of step a) and step b) are selected such that the second side of the substrate remains stable during these steps; and
   wherein the protective film is selected such that it protects the first layered structure from degradation during step c).

32. The method of claim 31, further comprising, after step e), the step of forming driver circuitry from the first layered structure.

33. The method of claim 31, wherein step e) further comprises the substep of selectively etching the protective film off of the first layered structure.

34. The method of claim 31, further comprising, between steps c) and e), the step of forming a temperature-sensitive element from the second layered structure.

35. The method of claim 31, further comprising, after step e), the step of forming a temperature-sensitive element from the first layered structure.

36. A method of fabricating an optoelectronic module comprising a substrate having a first side and a second side, comprising the steps of:
   a) depositing a first layered structure on the first side of the substrate;
   b) depositing a protective film on the first layered structure;
   c) depositing a second layered structure on the second side of the substrate;
   d) removing the protective film; and
   e) forming driver circuitry from the first layered structure
   wherein the conditions of step a) and step b) are selected such that the second side of the substrate remains stable during these steps; and
   wherein the protective film is selected such that it protects the first layered structure from degradation during step c).

37. The method of claim 36, wherein step d) further comprises the substep of selectively etching the protective film off of the first layered structure.

38. The method of claim 36, further comprising, between steps c) and d), the step of forming a temperature-sensitive element from the second layered structure.

39. The method of claim 36, further comprising, after step d), the step of forming a temperature-sensitive element from the first layered structure.

40. A method of fabricating an optoelectronic module comprising a substrate having a first side and a second side, comprising the steps of:
   a) depositing a first layered structure on the first side of the substrate;
   b) depositing a protective film on the first layered structure;
   c) depositing a second layered structure on the second side of the substrate;
   d) removing the protective film; and
   e) forming a temperature-sensitive element from the first layered structure
   wherein the conditions of step a) and step b) are selected such that the second side of the substrate remains stable during these steps; and
   wherein the protective film is selected such that it protects the first layered structure from degradation during step c).

41. A method of fabricating an optoelectronic module comprising a substrate having a first side and a second side, comprising the steps of:
   a) depositing a first layered structure on the first side of the substrate;
   b) depositing a protective film on the first layered structure;
   c) depositing a second layered structure on the second side of the substrate; and
   d) removing the protective film;
   wherein the conditions of step a) and step b) are selected such that the second side of the substrate remains stable during these steps;
   wherein the protective film is selected such that it protects the first layered structure from degradation during step c); and
   wherein the first layered structure and the second layered structure comprise III-V semiconductor materials.

42. The method of claim 41, further comprising, between steps c) and d), the step of forming a diode laser from the second layered structure.

43. The method of claim 41, further comprising, after step d), the step of forming driver circuitry from the first layered structure.

44. The method of claim 41, further comprising, between steps c) and d), the step of forming a temperature-sensitive element from the second layered structure.

45. The method of claim 41, further comprising, after step d), the step of forming a temperature-sensitive element from the first layered structure.

* * * * *